United States Patent
Sato et al.

(10) Patent No.: US 9,425,800 B2
(45) Date of Patent: Aug. 23, 2016

(54) RECONFIGURABLE LOGIC DEVICE

(71) Applicant: TAIYO YUDEN CO., LTD., Tokyo (JP)

(72) Inventors: Masayuki Sato, Tokyo (JP); Koushi Sato, Saitama (JP); Mitsunori Katsu, Tokyo (JP); Isao Shimizu, Gunma (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/781,880

(22) PCT Filed: Apr. 2, 2014

(86) PCT No.: PCT/JP2014/059703
§ 371 (c)(1),
(2) Date: Oct. 1, 2015

(87) PCT Pub. No.: WO2014/163099
PCT Pub. Date: Oct. 9, 2014

(65) Prior Publication Data
US 2016/0036447 A1     Feb. 4, 2016

(30) Foreign Application Priority Data
Apr. 2, 2013    (JP) .................................. 2013-076506

(51) Int. Cl.
*H03K 19/173*     (2006.01)
*H03K 19/177*     (2006.01)
*G06F 17/50*     (2006.01)

(52) U.S. Cl.
CPC ...... *H03K 19/17728* (2013.01); *G06F 17/5054* (2013.01); *H03K 19/1776* (2013.01); *H03K 19/17744* (2013.01)

(58) Field of Classification Search
None
See application file for complete search history.

(56) References Cited

U.S. PATENT DOCUMENTS 6,150,838 A    11/2000   Wittig et al.
6,208,163 B1    3/2001   Wittig et al.
(Continued)

FOREIGN PATENT DOCUMENTS

JP    2002-538652 A    11/2002
JP    2003-198361 A    7/2003
(Continued)

OTHER PUBLICATIONS

Written Opinion (PCT/ISA/237) issued in PCT/JP2014/059703 mailed in Sep. 2014.
(Continued)

*Primary Examiner* — Vibol Tan
(74) *Attorney, Agent, or Firm* — Chen Yoshimura LLP

(57) ABSTRACT

[Problem] To be able to provide a reconfigurable logic device having a small area and enhanced reprogramming characteristics.
[Solution] A reconfigurable logic device for forming a plurality of logic circuits in accordance with configuration data information. Each of the multi-lookup table units includes: a configuration memory that stores configuration data; data input lines; data output lines; and a reconfigurable logic multiplexer that, in response to the configuration data, selectively links data inputted to the data input lines to data outputted to the data output lines, and/or outputs, to the data output lines, data obtained by performing a logical operation on data pertaining to the inputted data. The multi-lookup tables that are adjacent to one another are connected through the data input lines and the data output lines of the respective multi-lookup table units.

14 Claims, 25 Drawing Sheets

(56) References Cited

U.S. PATENT DOCUMENTS

| | | | |
|---|---|---|---|
| 6,389,579 B1* | 5/2002 | Phillips | G03F 15/7867 716/113 |
| 7,183,796 B2* | 2/2007 | Leijten-Nowak | H03K 19/1776 326/37 |
| 7,251,672 B2* | 7/2007 | Leijten-Nowak | H03K 19/1737 708/235 |
| 7,486,109 B2* | 2/2009 | Sasao | H03K 19/17728 326/38 |
| 7,592,834 B1* | 9/2009 | Agrawal | H03K 19/17736 326/38 |
| 8,082,284 B2* | 12/2011 | Leijten-Nowak | H03K 19/1737 708/235 |
| 8,117,247 B1* | 2/2012 | Taylor | G06F 7/5057 708/235 |
| 8,138,788 B2* | 3/2012 | Honda | H03K 19/17728 326/38 |
| 2003/0122578 A1 | 7/2003 | Masui et al. | |
| 2009/0154282 A1 | 6/2009 | Satoh | |
| 2009/0290444 A1 | 11/2009 | Satoh | |
| 2012/0007635 A1 | 1/2012 | Hironaka et al. | |
| 2015/0280717 A1* | 10/2015 | Sato | H03K 19/1776 326/41 |
| 2015/0286762 A1* | 10/2015 | Sato | H03K 19/173 716/103 |

FOREIGN PATENT DOCUMENTS

| | | |
|---|---|---|
| JP | 2006-313999 A | 11/2006 |
| JP | 2009-194676 A | 8/2009 |
| JP | 2010-239325 A | 10/2010 |
| WO | 00/51239 A1 | 8/2000 |
| WO | 2007/060763 A1 | 5/2007 |

OTHER PUBLICATIONS

International Search Report (ISR) issued in PCT/JP2014/059703 mailed in Sep. 2014.

* cited by examiner

RECONFIGURABLE LOGIC DEVICE

TECHNICAL FIELD

The present invention relates to a reconfigurable logic device.

BACKGROUND ART

Reconfigurable (programmable or writable) semiconductor devices such as FPGAs (field-programmable gate arrays) are widely used due to the flexibility imparted by the rewriting capabilities thereof (Patent Document 1, for example).

Typical island-style FPGAs are constituted by logic elements CLBs (configurable logic blocks), switch elements SBs and CBs, and input/output elements IOBs.

Logic elements CLBs can be programmed to realize a combinatorial circuit, and each of the CLBs is constituted by a data flip-flop (DFF), LUT (lookup table), and the like. A k-input LUT (k-LUT) uses a $2^k$ amount of SRAM (static random access memory) cells to realize a function of k variables. Truth tables of the desired logic functions are held in the SRAM and output is performed by referring to the truth tables in response to input, for example.

In order to generate signal routes between the CLBs, which cause the logic function parts to link to one another, the switch elements CBs and SBs are provided between the CLBs, and these switch elements can switch the signal routes. The switch elements CBs are set between logic blocks LB and wiring channels, and the switch elements SBs perform configuration between vertical and horizontal wiring lines at the intersection points of the wiring lines in the vertical and horizontal directions.

The input/output elements IOBs are configuration elements that serve as an interface between the input/output of the device and the logic elements LBs.

The applicants and inventors of the present invention have developed an "MPLD (memory-based programmable logic device)" (registered trademark) that realizes circuit configurations with memory cell units. Patent Document 1 below, for example, discloses an MPLD. The MPLD is connected to memory arrays called MLUTs (multi-lookup tables). MLUTs store truth table data and are constituted by wiring elements and logic elements. The MLUTs, when arranged in an array and connecting with the MPLD, realize a function that is approximately the same as an FPGA. Furthermore, the MPLD uses the MLUTs as both logic elements and wiring elements via the truth table data, thereby imparting flexibility to the logic regions and wiring regions (Patent Document 2, for example), which differs from an FPGA, which has specialized switching circuits for connection between the memory cell units.

RELATED ART DOCUMENTS

Patent Documents

Patent Document 1: Japanese Translation of PCT International Application Publication No. 2002-538652
Patent Document 2: WO 2007/060763

SUMMARY OF THE INVENTION

Problems to be Solved by the Invention

As described above, the FPGA is a reconfigurable device, but has a larger area than an ASIC (application-specific integrated circuit). This is because the wiring lines and switches occupy approximately 70 to 80% of the total area of the FPGA. The logic elements and the wiring elements of the FPGA are also realized by differing devices, which restricts reconfiguration of the FPGA.

An embodiment of the present invention provides a programmable logic device having a small area and enhanced reprogramming characteristics.

Means for Solving the Problems

Aspects to solve the above-mentioned problems are described by the items below.

1. A reconfigurable logic device for forming a plurality of logic circuits in accordance with configuration data, including:
   a plurality of multi-lookup table units,
   wherein each of the multi-lookup table units includes:
      a rewritable configuration memory that stores configuration data for the multi-lookup table unit; and
      data input lines;
      data output lines; and
      a reconfigurable logic multiplexer connected to the rewritable configuration memory, the reconfigurable logic multiplexer performing one of or both of:
         in accordance with the configuration data, selectively linking at least some of the data input lines to at least some of the data output lines so that data inputted to said at least some of the data input lines are transmitted to said at least some of the data output lines, and
         in accordance with the configuration data, outputting, to at least some of the data output lines, data obtained by performing a logical operation on data received from at least some of the data input lines, and
   wherein the multi-lookup table units that are adjacent to one another are connected through the data input lines and the data output lines of the respective multi-lookup table units.

2. The reconfigurable logic device according to item 1, wherein the configuration data in each of the plurality of multi-lookup table units includes a plurality of truth tables each of which defines a logical operation or connective paths, and
   wherein one of the plurality of truth tables is selected in accordance with the data inputted from at least some of the data input lines.

3. The reconfigurable logic device according to item 1 or 2, wherein the reconfigurable logic multiplexer is provided in a plurality in each of the multi-lookup table units, and
   wherein one of the reconfigurable logic multiplexers is provided for each combination of a direction of the data input line and a direction of the data output line.

4. The reconfigurable logic device according to any one of items 1 to 3, wherein each of the plurality of multi-lookup table units includes:
   a holding unit that holds the configuration data read out from the configuration memory and outputs the configuration data that is held to the reconfigurable logic multiplexer.

5. The reconfigurable logic device according to any one of items 1 to 4, wherein the reconfigurable logic multiplexer in each of the plurality of multi-lookup table units selects and outputs the configuration data held by the holding unit in accordance with the data inputted from the data input lines.

6. The reconfigurable logic device according to any one of items 1 to 5, wherein at least some of the data input lines of one of the respective multi-lookup tables units are connected to at least some of the data output lines of the multi-lookup table units adjacent thereto.

7. The reconfigurable logic device according to any one of items 1 to 6, wherein the configuration memory includes a plurality of memories, one of the plurality of memories being provided for each data output direction.

8. The reconfigurable logic device according to any one of items 1 to 7, wherein the configuration memory in each of the plurality of multi-lookup table units includes a clock transition detecting unit that generates a clock at a moment when an address to be outputted to the configuration memory is received, and wherein the configuration memory operates in synchronization with the clock.

9. The reconfigurable logic device according to any one of items 1 to 8, wherein at least one of the plurality of truth tables is outputted to data output lines that are respectively connected to address lines of the configuration memory, and wherein the plurality of truth tables are written in the configuration memory in accordance with inputs from the address lines.

10. The reconfigurable logic device according to any one of items 1 to 9, wherein the plurality of truth tables are written in the configuration memory in accordance with inputs from address lines that are connected to outside.

11. A method of controlling a reconfigurable logic device that forms a plurality of logic circuits in accordance with configuration data, the reconfigurable logic device having a plurality of multi-lookup table units, each of the multi-lookup table units including a rewritable configuration memory that stores configuration data for the multi-lookup table unit, data input lines, data output lines, and a reconfigurable logic multiplexer connected to the rewritable configuration memory, wherein the multi-lookup table units that are adjacent to one another are connected through the data input lines and the data output lines of the respective multi-lookup table units, the method including:

causing the reconfigurable logic multiplexer to receive the configuration data and, in accordance therewith, selectively link at least some of the data input lines to at least some of the data output lines so that data inputted to said at least some of the data input lines are transmitted to said at least some of the data output lines; and causing the reconfigurable logic multiplexer to receive the configuration data and, in accordance therewith, output, to at least some of the data output lines, data obtained by performing a logical operation on data received from at least some of the data input lines.

12. The method according to item 11, wherein each of the plurality of multi-lookup table units includes a holding unit that holds the configuration data read out from the configuration memory and outputs the configuration data that is held to the reconfigurable logic multiplexer, and wherein the reconfigurable logic multiplexer selects and outputs the configuration data held by the holding unit in accordance with the inputted data from the data input lines.

13. The method according to item 11 or 12, wherein the configuration memory in each of the plurality of multi-lookup table units includes a clock transition detecting unit that generates a clock at a moment when an address to be outputted to the configuration memory is received, and wherein the configuration memory operates in synchronization with the clock.

14. A non-transitory storage medium that stores instuctions executable by a processor, the instructions being for controlling a reconfigurable logic device having a plurality of multi-lookup table units, each of the multi-lookup table units including a rewritable configuration memory that stores configuration data for the multi-lookup table unit, data input lines, data output lines, and a reconfigurable logic multiplexer connected to the rewritable configuration memory, wherein the multi-lookup table units that are adjacent to one another are connected through the data input lines and the data ouput lines of the respective multi-lookup table units, the instructions causing the processor to perform the following:

causing the reconfigurable logic multiplexer to receive the configuration data and, in accordance therewith, selectively link at least some of the data input lines to at least some of the data output lines so that data inputted to said at least some of the data input lines are transmitted to said at least some of the data output lines; and causing the reconfigurable logic multiplexer to receive the configuration data, and, in accordance therewith, output, to at least some of the data output lines, data obtained by performing a logical operation on data receive from at least some of the data input lines.

Effects of the Invention

A semiconductor device according to the present embodiment can provide a small area and enhanced reprogramming characteristics.

BRIEF DESCRIPTION OF THE DRAWINGS

FIG. 12A is a view of one example of configuration data stored in a configuration memory on the left side of an MLUT 30A.

FIG. 12B is a view of one example of configuration data stored in a configuration memory on the right side of an MLUT 30A.

FIG. 12C is a view of one example of configuration data stored in a configuration memory on the left side of an MLUT 30B.

FIG. 12D is a view of one example of configuration data stored in a configuration memory on the right side of an MLUT 30B.

FIG. 12E is a view of one example of configuration data stored in a configuration memory on the left side of an MLUT 30C.

FIG. 12F is a view of one example of configuration data stored in a configuration memory on the right side of an MLUT 30C.

FIG. 12G is a view of one example of configuration data stored in a configuration memory on the left side of an MLUT 30D.

FIG. 12H is a view of one example of configuration data stored in a configuration memory on the right side of an MLUT 30D.

FIG. 12I is a view of one example of configuration data stored in a configuration memory on the left side of an MLUT 30E.

FIG. 12J is a view of one example of configuration data stored in a configuration memory on the right side of an MLUT 30E.

DETAILED DESCRIPTION OF EMBODIMENTS

The following will be described below in the stated order with reference to the drawings: [1] a reconfigurable logic device, [2] an MLUT array, [3] an MLUT, [4] page control, [5] configuration data, and [6] a truth table data generation method.

[1] Reconfigurable Logic Device

Figure 1:
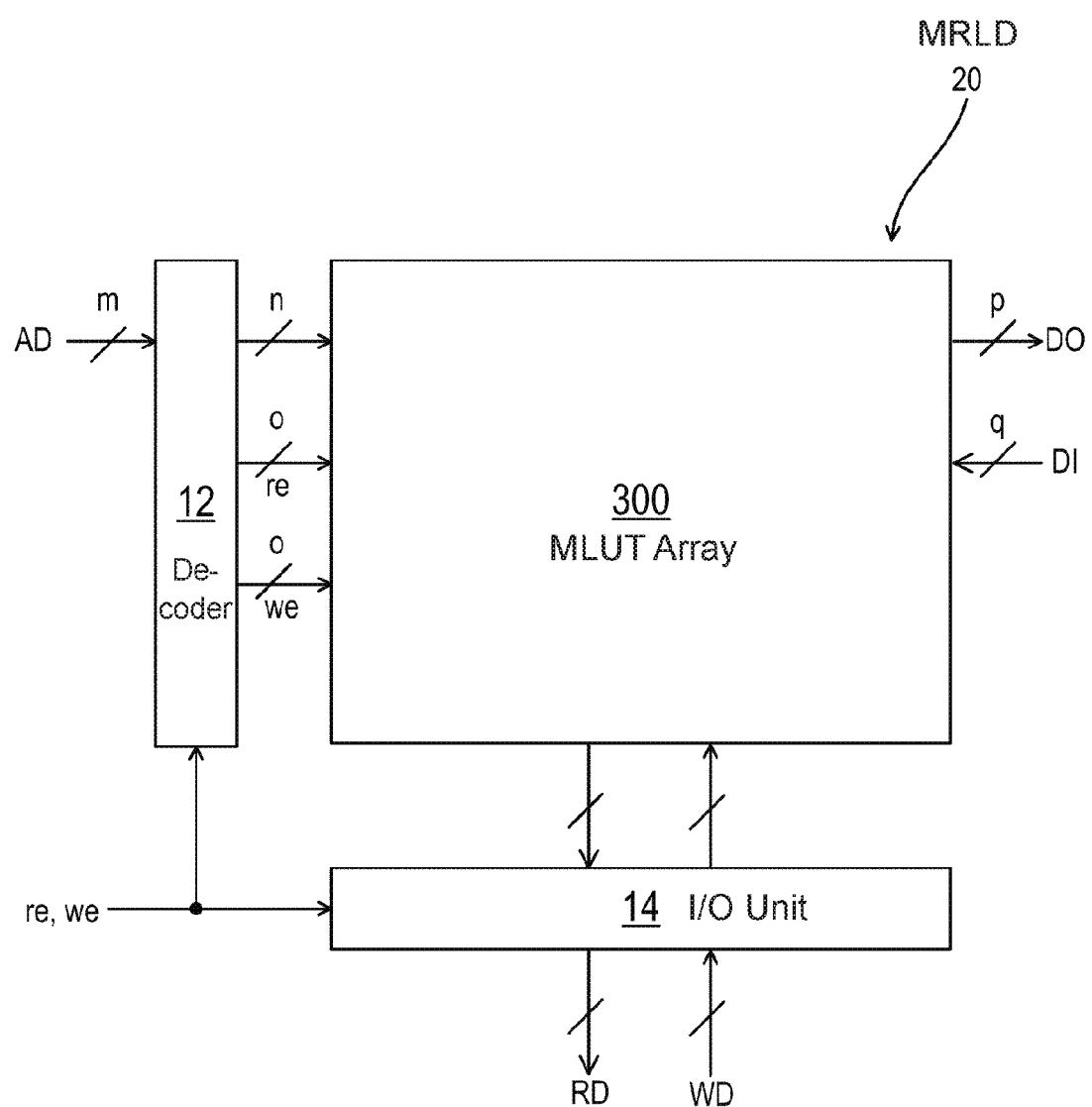
FIG. 1 is a view of an overall configuration of a semiconductor device according to the present embodiment.

FIG. 1 is a view of one example of a reconfigurable logic device according to the present embodiment. Hereinafter, the reconfigurable logic device will be called an MRLD (memory-based reconfigurable logic device) (registered trademark). The MRLD is similar to the MPLD developed by the subject applicants in that the respective MLUTs are directly connected to one another without having wiring elements interposed therebetween, but differs in actively utilizing ordinary SRAM functions.

The MRLD is a device having functions that are approximately the same as an FPGA, but the structure of the MRLD differs from the FPGA. An FPGA is constituted by CLBs, switch blocks, connection blocks, and the like, and the allocation between logic resources and wiring resources is fixed. In contrast, the MRLD greatly differs from an FPGA in that the MRLD has an array of MLUTs that can be used as both logic elements and wiring elements and in that the MLUTs are directly connected to one another.

An MRLD 20 shown in FIG. 1 has an MLUT array 300 in which a plurality of MLUTs (multi-lookup tables; described later) are arranged in an array, a decoder 12 that identifies memory read/write operations of the MLUTs, and an input/output unit 14.

The logic operations of the MRLD 20 use the data input DI and data output DO signals represented by the respective bold lines. The data input DI is used as the input signal of the logic circuit. The data output DO is used as the output signal of the logic circuit (described later with FIG. 2).

The logic that is realized by logical operation of the MRLD 20 is realized by truth table data stored in the MLUTs 30. Several of the MLUTs 30 operate as logic elements as combinatorial circuits having AND circuits, adders, or the like. Other MLUTs function as connective elements that respectively connect the MLUTs 30 realizing the combinatorial circuits to one another. The rewriting of the truth table data for the MRLD 20 to realize the logic elements and connective elements is performed by writing operation to the configuration memory of the respective MLUTs 30.

The writing operation of the MRLD 20 is performed with a write address AD and write data WD, and the read operation is performed with a read address AD and read data RD.

The write address AD identifies memory cells within the MLUTs 30. The write address AD identifies a $2^m$ number n of memory cells with an m amount of signal lines. The write address AD is used both for memory read operation and write operation and selects the relevant memory cells via the m amount of signal lines after decoding by the decoder 12. It should be noted that, in the present embodiment, the decoding of the logical operation address DI is performed by a decoder within the MLUT 30, as described later.

The decoder 12, in accordance with control signals such as a read enable signal re and a write enable signal we, decodes the write address AD and outputs the decoded address n to the MLUT 30. The decoded address n is used as an address for identifying the memory cell within the configuration memory of the MLUT 30.

The input/output unit 14 writes the write data WD in accordance with the write enable signal we, and outputs the read data RD in accordance with the read enable signal re.

[2] MLUT Array

Figure 2:
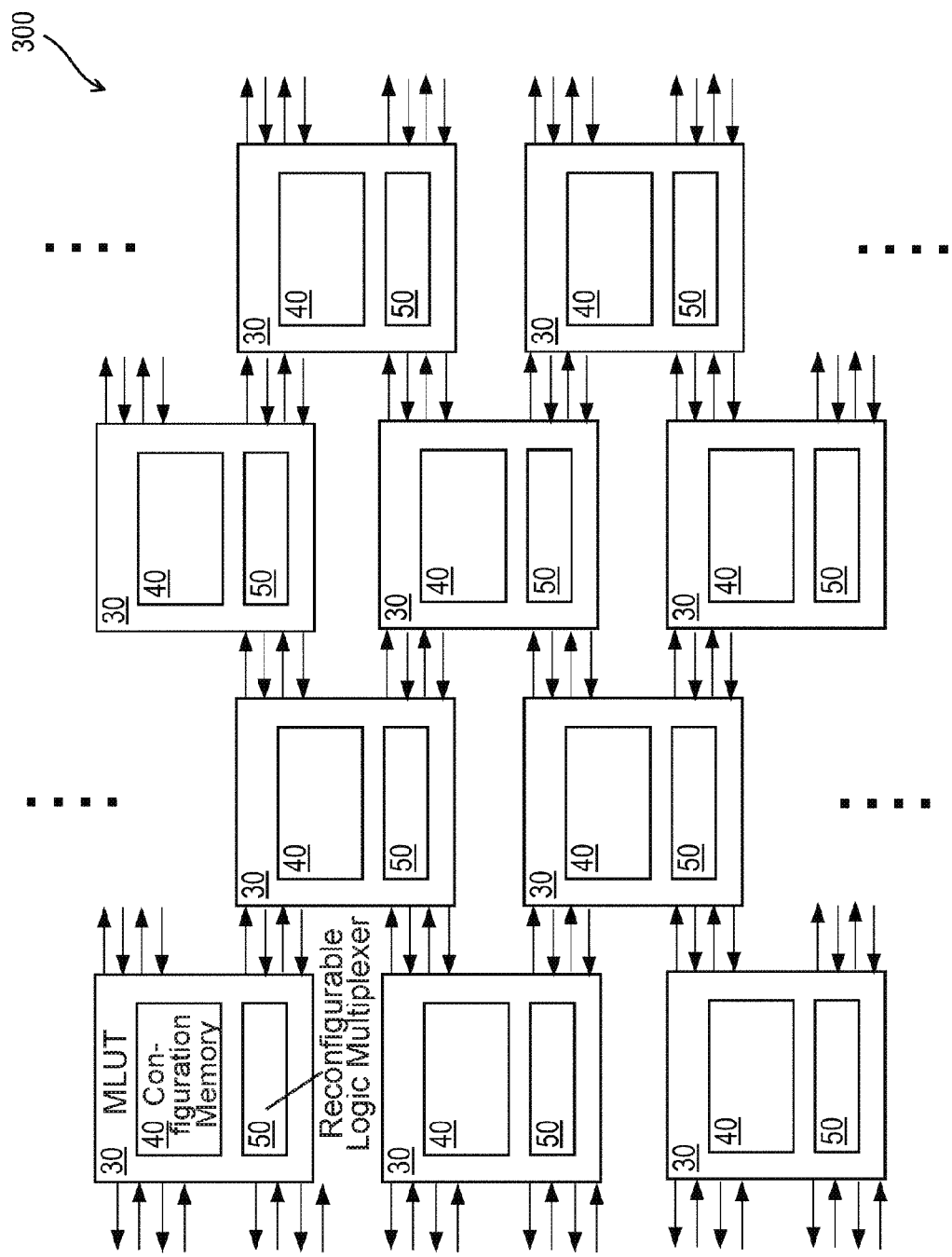
FIG. 2 is a view of one example of a bi-directional MLUT array.

FIG. 2 is a view of one example of a bi-directional MLUT array. The arrows shown in FIG. 2 are data input lines and data output lines that connect the abutting MLUTs. In the MLUT array 300 shown in FIG. 2, the individual MLUTs 30 are connected to other abutting MLUTs 30 by two data input lines and two data output lines each. In other words, the connection among the MLUTs is realized by the plurality of data input lines and data output lines. Furthermore, in order to enhance programmability, the individual MLUTs connect to two abutting MLUTs in the input direction and two abutting MLUTs in the output direction. This arrangement is hereinafter referred to as the "alternating arrangement."

The alternately arranged MLUTs having a plurality of data lines and bit lines allow for multi-bit data processing and can also limit the flow direction of data in the input and output direction, thereby facilitating the creation of logic libraries.

The respective MLUTs 30 can execute a large number of differing logical functions. Each of the MLUTs 30 has a configuration memory 40 and a reconfigurable logic multiplexer 50. The logical function executed by each of the MLUTs 30 is determined by the configuration data stored in the configuration memory 40 of the corresponding MLUT. The MLUT 30 has an input for configuration data, and an output for configuration data for output to the reconfigurable logic multiplexer 50. The configuration data is loaded into the configuration memory 40 from outside the MRLD 20 via the address lines and data lines.

The reconfigurable logic multiplexer 50 has a data input, data output, and a configuration input for receiving configuration data, and controls the connection state between the data input and output in response to these. In accordance with the configuration data, the reconfigurable logic multiplexer 50 outputs, to the data output line, data that has been logically operated pertaining to the data input.

Figure 3:
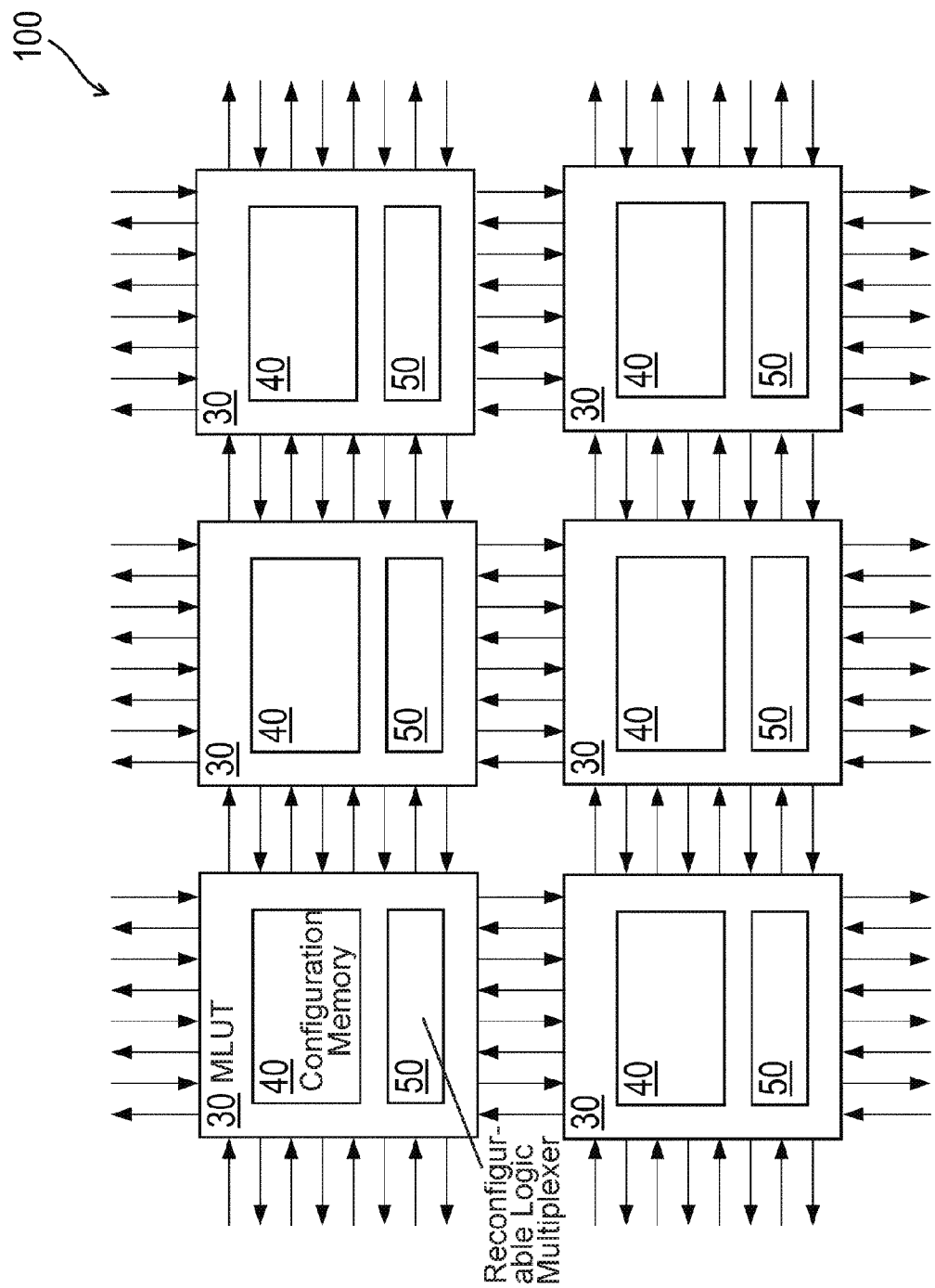
FIG. 3 is a view of one example of a quad-directional MLUT array.

FIG. 3 is a view of one example of a quad-directional MLUT array. The directional arrangement in FIG. 3 is similar to an FPGA. Adopting such an arrangement in this manner allows for a configuration resembling an FPGA, which facilitates the creation of MRLD configuration data by using a logically configured state that has been generated by FPGA tools. For example, truth table data can be generated from this FPGA-configured state by CLB-equivalents of the FPGA being able to be expressed with the top-left, top-middle, and bottom-left in the drawing as switching blocks and the bottom-middle as LUT blocks.

[3] MLUT

Figure 4A:
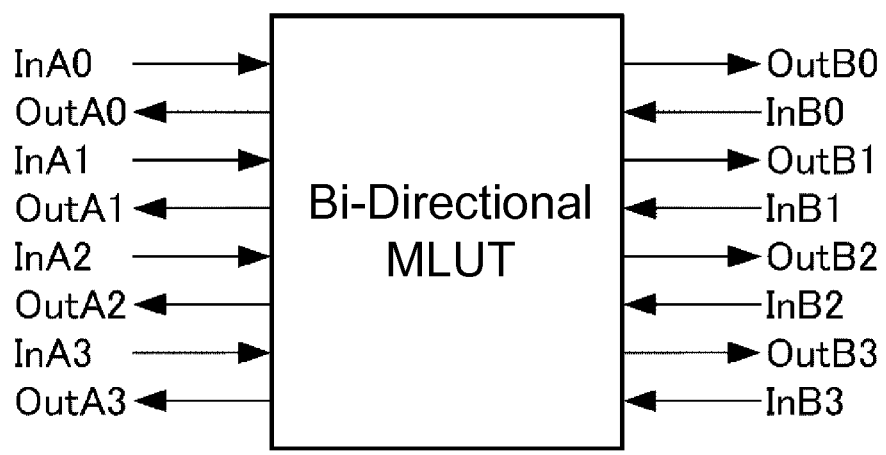
FIG. 4A is a view of an arrangement example of signal lines of a bi-directional MLUT.

FIG. 4A is a view of an arrangement example of signal lines of a bi-directional MLUT. As shown in FIG. 4A, the data inputs from the left are InA0 to InA3, and the data outputs to the left are OutA0 to OutA3. The data inputs from the right are InB0 to InB3, and the data outputs to the right are OutB0 to OutB3.

Figure 4B:
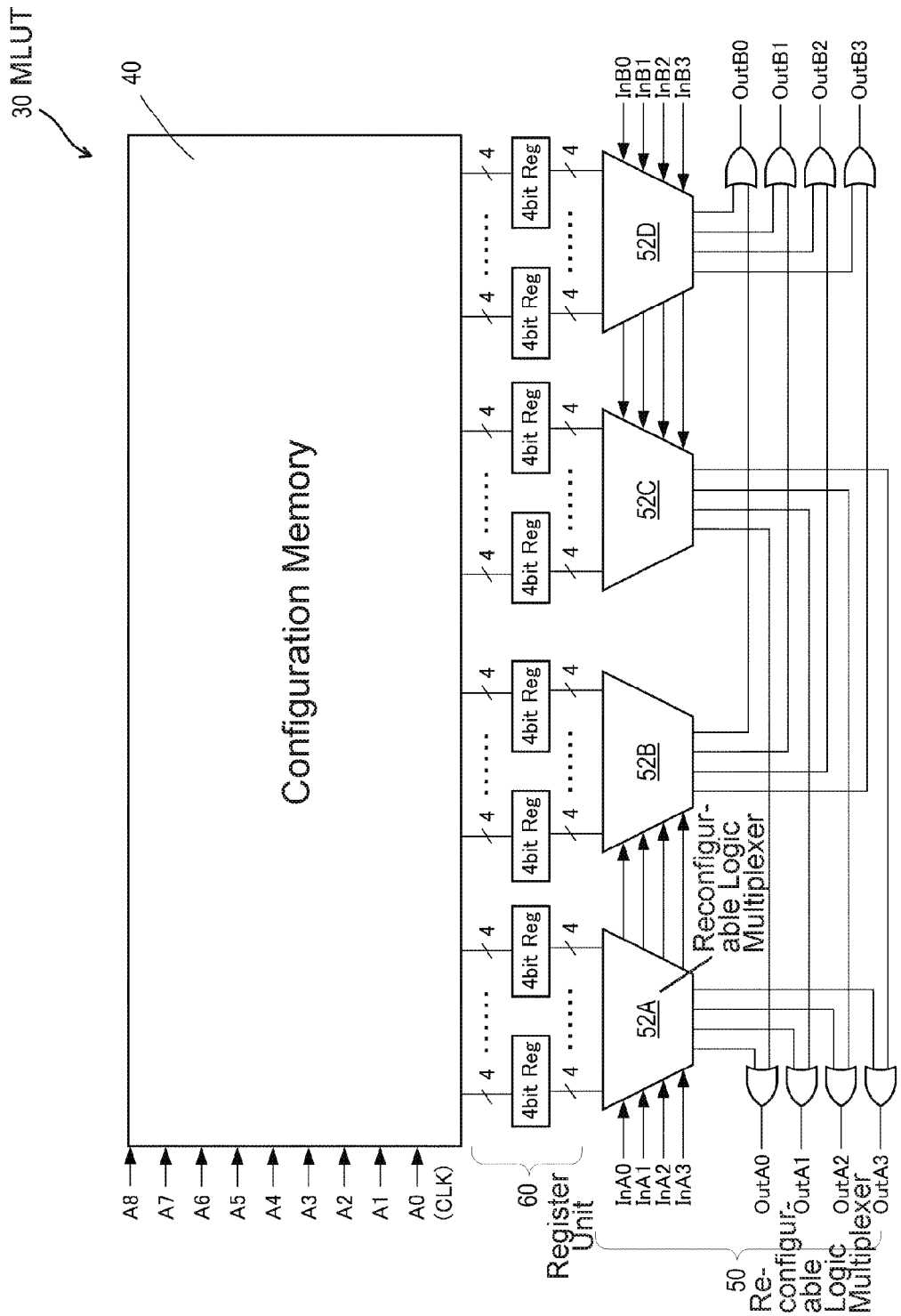
FIG. 4B is a view of one example of a bi-directional MLUT.

FIG. 4B is a view of one example of a bi-directional MLUT. The signal lines of the MLUT shown in FIG. 4B are the same as the signal lines of the MLUT shown in FIG. 4A. The MLUT 30 shown in FIG. 4B has the configuration memory 40, the reconfigurable logic multiplexer 50, and a register unit 60. The configuration memory 40 is an SRAM, for example. The configuration memory 40 connects with a plurality of address lines A0 to A8 for identifying the memory cells that store configuration data. In the example shown in FIG. 3, each configuration memory has, with nine addresses, "512" word lines, which is $2^9$, and 256 bit lines (also called "data lines"). There are four inputs for a combination thereof of 16, and thus 16 registers are required. Furthermore, 16 are required at 4 bits, and data from left to left, left to right, right to left, and right to right is also required, which means 4 bits×16×4, equaling 256 bit lines. Accordingly, the configuration memory has $2^9$×256 memory cells. It should be noted that A0 has a positive-type address transition detector (ATD) circuit and serves as a clock input (described later with FIG. 6).

[3.1] Configuration Memory

The configuration memory 40, in accordance with clock A0, reads data via a sense amp (not shown) from the memory cells identified by the addresses and outputs the data to the register unit 60, which has a number of registers corresponding to the relevant bits (256 bits in the example in FIG. 2). The register unit 60 is constituted by a plurality of registers that continue to hold the data until new data is output from the configuration memory 40.

Figure 5:
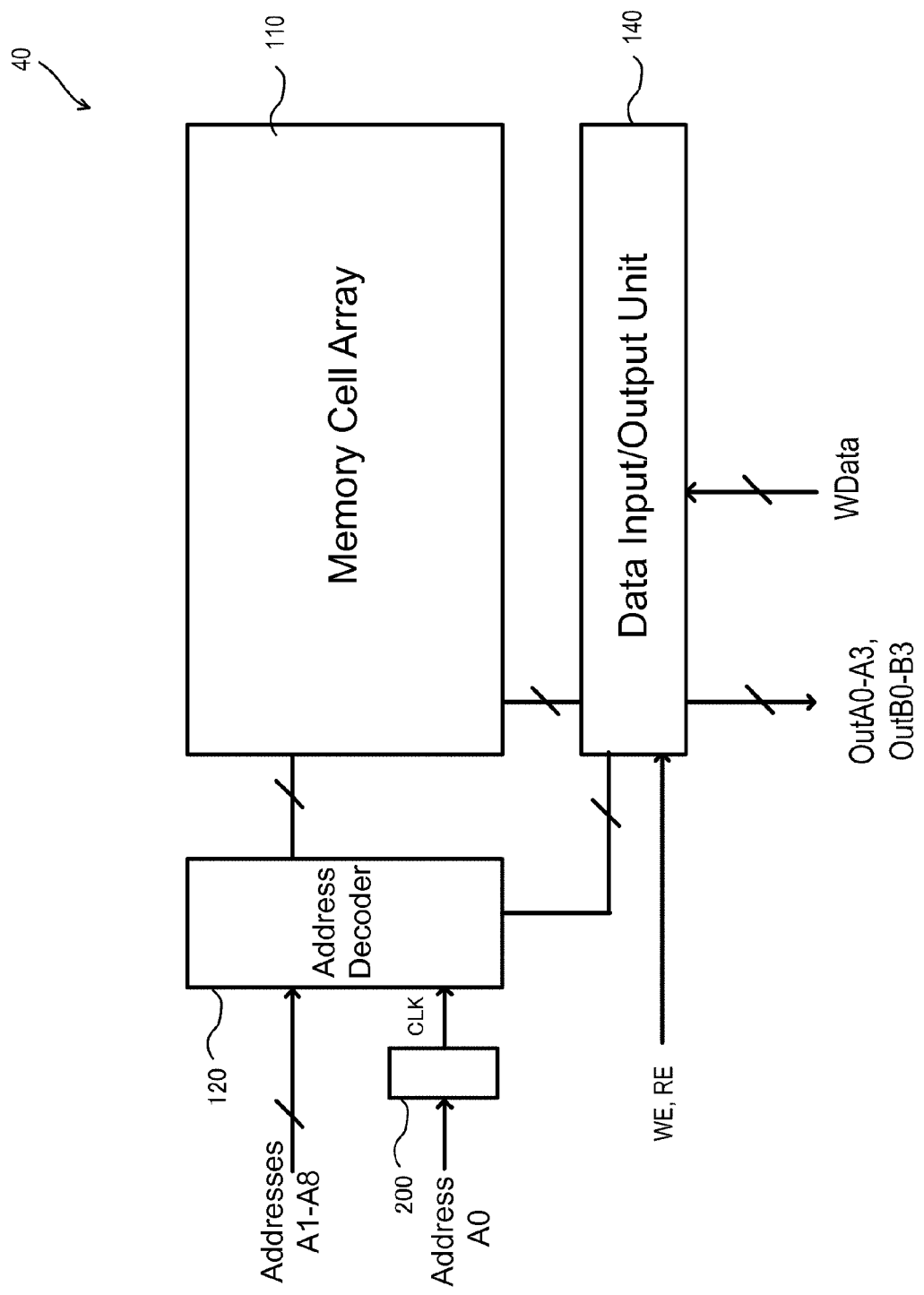
FIG. 5 is a view of one example of a configuration memory.

FIG. 5 is a detailed view of the configuration memory. The configuration memory 40 shown in FIG. 5 has a memory cell array 110 constituted by memory cells that each store data, an address decoder 120, a clock transition detecting unit 200 (described later with FIG. 6A), and a data input/output unit 140 that performs data read/write to the memory cell array 110. It should be noted that, in the present embodiment, the configuration memory 40 is a synchronous SRAM that performs read/write operations in synchronization with the clock. Accordingly, the address decoder 120 and the data input/output unit 140 operate in synchronization with the clock.

The memory cell array 110 has an n×$2^m$ amount of memory cells (and corresponding storage elements), and the amount of memory cells are provided at the nodes of the n×$2^m$ amount of word lines and the n amount of bit lines (hereinafter also referred to as "data lines").

When the address decoder 120 receives address signals from the m amount of address signal lines in synchronization with the clock generated by the A0 clock transition detecting unit, the address decoder 120 decodes these address signals, outputs a word line select signal as a decode signal and a data line select signal selected at the data input/output unit 140 to the $2^m$ amount of word lines WL, and causes the data read/write processes relative to the corresponding memory cells to be performed.

The data input/output unit 140 has a write amp and a sense amp. If the write amp receives rising edge timing and write data of the write enable (WE) from outside, for example, then the write amp transmits the signal level of the write data to the m amount of data lines b,/b and writes the data to the memory cells. When the data input/output unit 140 receives rising edge timing of the read enable (RE) from outside, the sense amp outputs the signal level of the m amount of data lines b,/b to outside, thereby outputting read data.

It should be noted that the configuration memory shown in FIG. 5 may be provided in each direction of the wiring lines. This would be two configuration memories in the bi-directional arrangement in FIG. 2, and four configuration memories in the quad-direction arrangement in FIG. 3, for example. Providing a configuration memory for each direction in this manner decreases the number of addresses as compared to only a single memory ($2^9$×4 is less than $2^{36}$), which allows for the capacitance of the memory to be lowered.

Figure 6A:
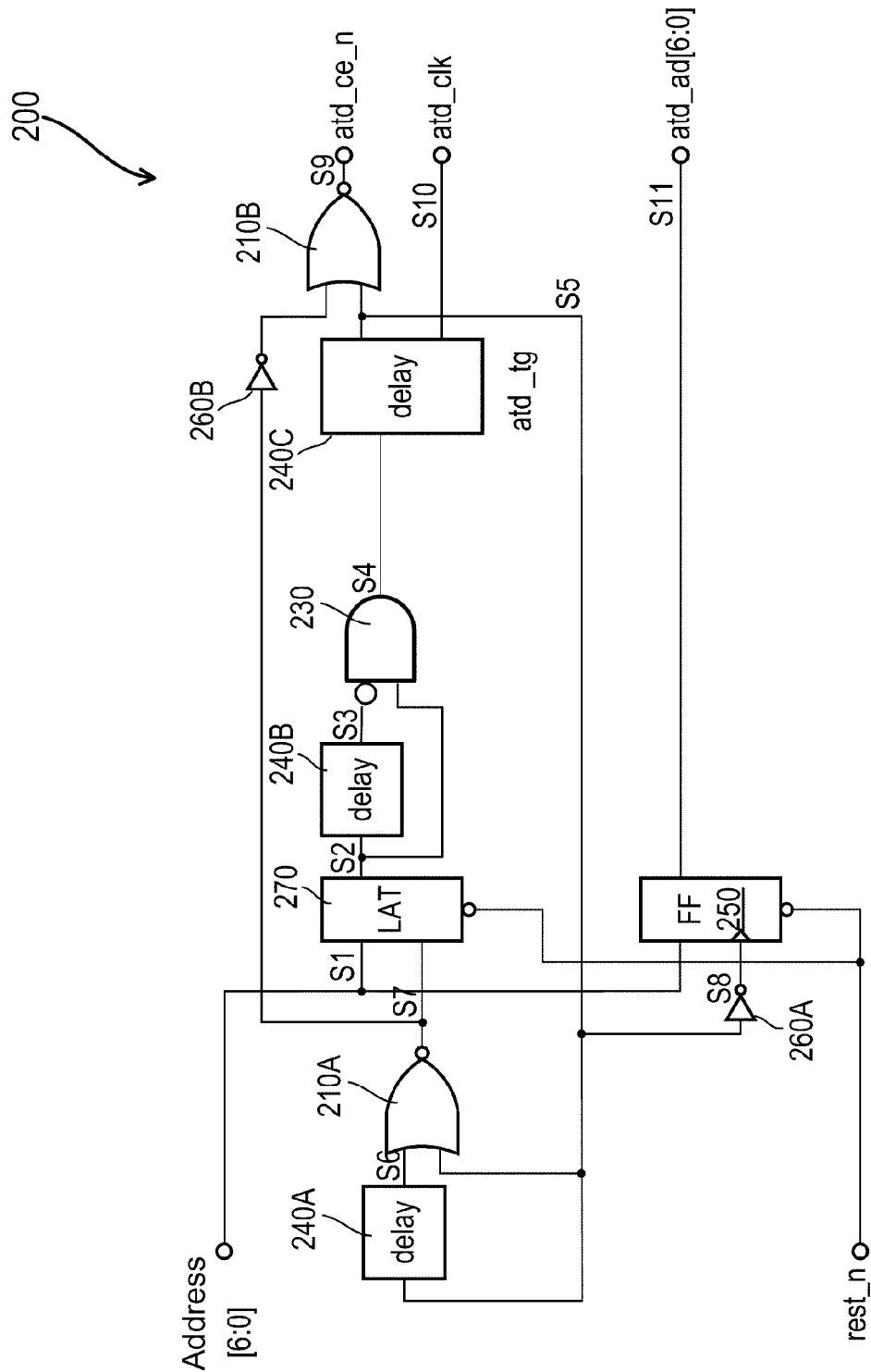
FIG. 6A is a view of one example of a clock transition detecting unit.

FIG. 6A is a circuit diagram of a clock transition detecting unit according to the present embodiment. The clock transition detecting unit 200 shown in FIG. 6A has negated OR (NOR) circuits 210A and 210B, an AND circuit 230, delay circuits 240A to 240C, a flip-flop (FF) 250, inverters 260A and 260B, and a D latch 270.

Figure 6B:
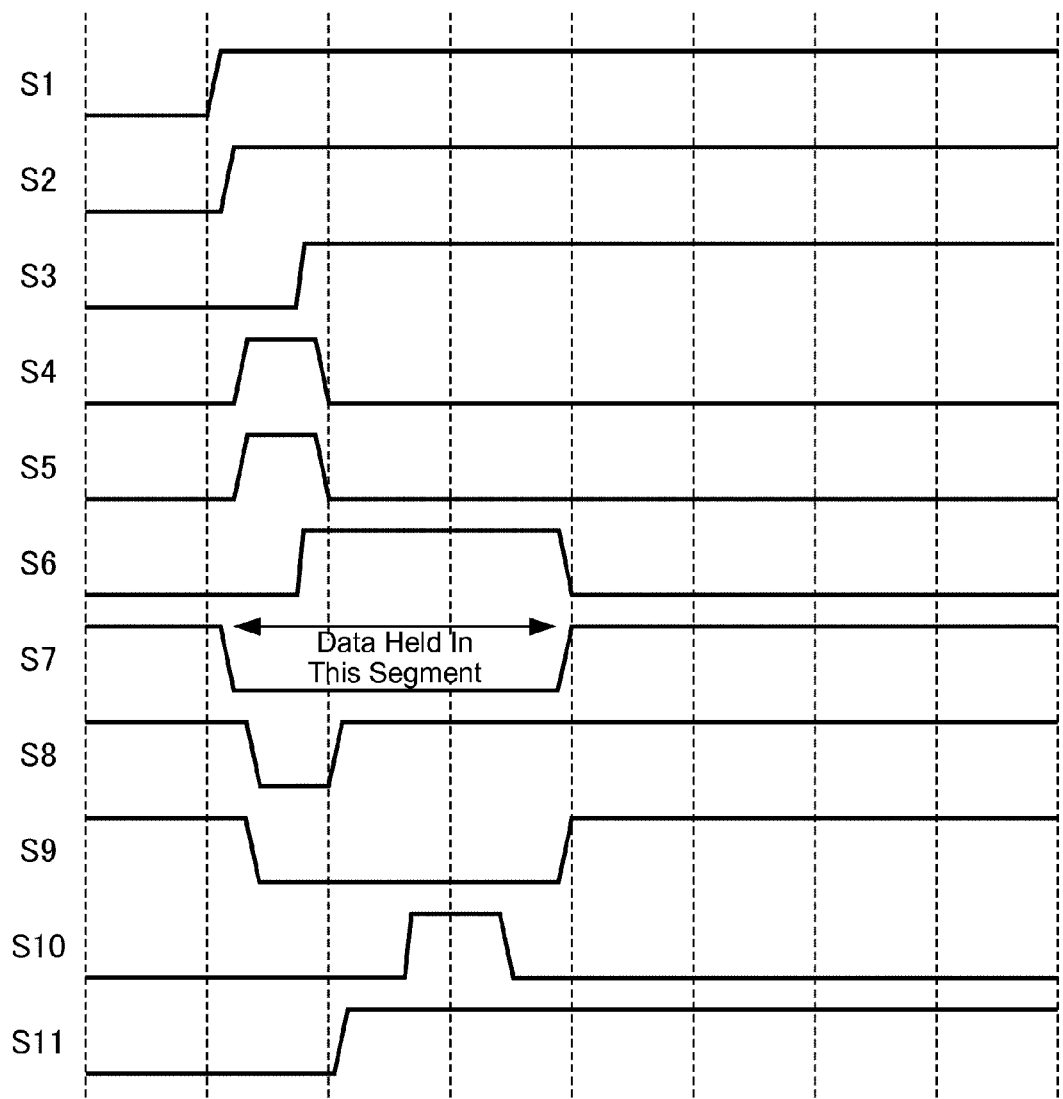
FIG. 6B is a view of one example of a time chart of the clock transition detecting unit.

FIG. 6B is a timing chart of signals of the clock transition detecting unit shown in FIG. 6A. Signal S1 is an address input signal for the configuration memory. In the present embodiment, this is address A0. Signal S2 is output of the D latch. The D latch 270 latches when there is a change in the signal S1 so as not to change for a certain period of time. This is for ignoring subsequent address transitioning with noise or the like. Signal S3 is a delay signal output from the D latch 270. The delay signal, as shown in FIG. 6B, is delayed at the delay circuit 240B in order to create a clock at the rise and fall thereof and to generate the clock width of signal S4.

The signal S4 generated as the clock signal is output from the AND circuit 230. The AND circuit 230 receives the input and output of the delay circuit 240B; therefore, if the signal level of both differs, the AND circuit 230 outputs a "high" signal level. This enables detection of address transition.

Signal S5 is a delay signal output from the delay circuit 240C, and waits for an enable signal of the LAT 270 and receives a clock.

Signal S6 is a signal extension of signal S5 and is a pulse generation of the enable signal. The NOR circuit 210A outputs signal S7, which is a NOR computational value of signals S5 and S6. The signal S7 serves as the enable signal of the D latch 270. Signal S8 is signal S5 that has been inverted by the inverter 260A and is used as the clock for the latch of the address signal at the FF 250. The signal S9 is used as an enable signal of the configuration memory; signal S10 is used as a clock (atd_clk) for the configuration memory; and signal S11 is used as an address for the configuration memory. In this manner, the signal S1, which is address A0, generates the clock signal S10; thus, a synchronous SRAM can be used as the configuration memory.

Figure 6C:
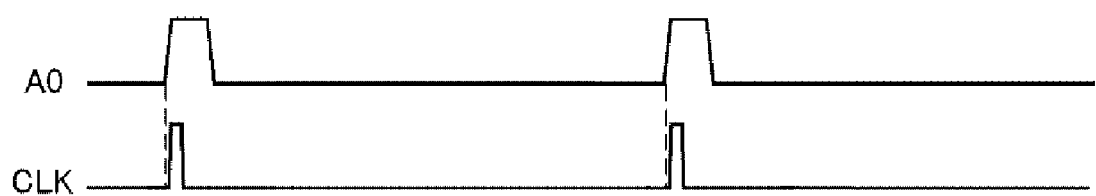
FIG. 6C is one example of a time chart of an address of the clock transition detecting unit and a generated clock.

FIG. 6C is a timing chart that shows a relationship between address A00 and a generated clock signal. In FIG. 6C, only signals S1 and S10 are shown. If a clock is generated at the rise from "Low" of address A0 to "Hi" and also generated at the fall from "Hi" of address A0 to "Low," then even if data is written at the rise during data writing, this data will not be held because there will be a return to the initial memory data during the fall. As a countermeasure, the MRLD 20 has the positive-type address transition detecting (ATD) unit 200. In this manner, the positive-type ATD circuit generates CLK only at the rise of A0, and thus holds the address inside the memory at Hi. The configuration data held at Hi is output and held in the registers of the register unit 60 without CLK being generated when A0 becomes Low. This allows the MLUT 30 to configure sequential circuits without providing actual circuits such as flip-flops or the like.

[3.2] Reconfigurable Logic Multiplexer

The number of reconfigurable logic multiplexers 50 is equal to the amount of data wiring line routes. The MLUT 30 has reconfigurable logic multiplexers 52A, 52B, 52C, and 52D, for example.

In accordance with the configuration data held in the register unit 60, the multiplexers cause the data inputs to connect with the data outputs, and these connective paths are reconfigurable by the configuration data. This operation involves selecting and outputting "input signals" by setting the data held in the register unit 60 as the "input signals" and setting the data inputs as the "select control signals."

A. Implementation of Logic Functions

In the example shown in FIG. 4B, the registers respectively hold four pairs of four bits representing the results of the logical computations read from the configuration data. In other words, in the configuration data, the four bit data has values corresponding to truth table data, such as AND, OR, NOT, NOR, EX-OR, or the like. The reconfigurable logic multiplexer 52A and the like are 16-to-1 multiplexers, and select four bits of 16-to-"2 directions×2×16" as one pair of four bits in accordance with the data inputs. In other words, the data input number (4 in FIG. 4B) and the configuration data (4 directions×4 pairs of 4 bit data in the example in FIG. 4B) constituting the number of wiring directions (4 in FIG. 4B) are stored in the configuration memory 40.

B. Implementation of Wiring Functions

The respective reconfigurable logic multiplexers use the data inputs as select signals to select any of the plurality of truth table data in accordance with the data inputs. The respective configurable logic multiplexers realize desired wiring routes that connect the data inputs from the data input lines to the data outputs for the data output lines. There are a plurality of the reconfigurable logic multiplexers; one for each combination of data input line direction and data output line direction. The reconfigurable logic multiplexers 52A, 52B, 52C, and 52D are provided for, respectively, the wiring route from the left side input to the left side output, the wiring route from the left side input to the right side output, the wiring route from the right side input to the right side output, and the wiring route from the right side input to the left side output, for example. If the reconfigurable logic multiplexer 52A is selected by the data input rather than the reconfigurable logic multiplexer 52B, for example, then the input signal (configuration data) selected by the reconfigurable logic multiplexer 52B in accordance with the data input is "0" and is the logical sum of the signal of 52A and the signal of 52C; therefore, the signal from left to the left is prioritized, which forms a signal path from left to left. The input signal (configuration data) selected by the reconfigurable logic multiplexer 52A in accordance with the data input has a prescribed logic value, which is output to the left.

The configuration data will be explained in detail later with FIG. 12. The reconfigurable logic multiplexers 52A and 52C are logically added, and setting the configuration data of the reconfigurable logic multiplexer 52C to "0" makes it possible to output the signals of InA0 to InA3 from the left to the left at prescribed logic values. Furthermore, the reconfigurable logic multiplexers 52B and 52D are logically added, and setting the reconfigurable logic multiplexer 52D to "0" outputs the signals of InA0 to InA3 to the right. The signals of InB0 to InB3 are output to the left and right using a similar method to this.

As described above, the reconfigurable logic multiplexer 50 is provided in accordance with the wiring routes, and having the configuration data selecting the logical computation values and wiring allows the multiplexer to operate like a logical computation circuit and/or a switch.

Figure 7A:
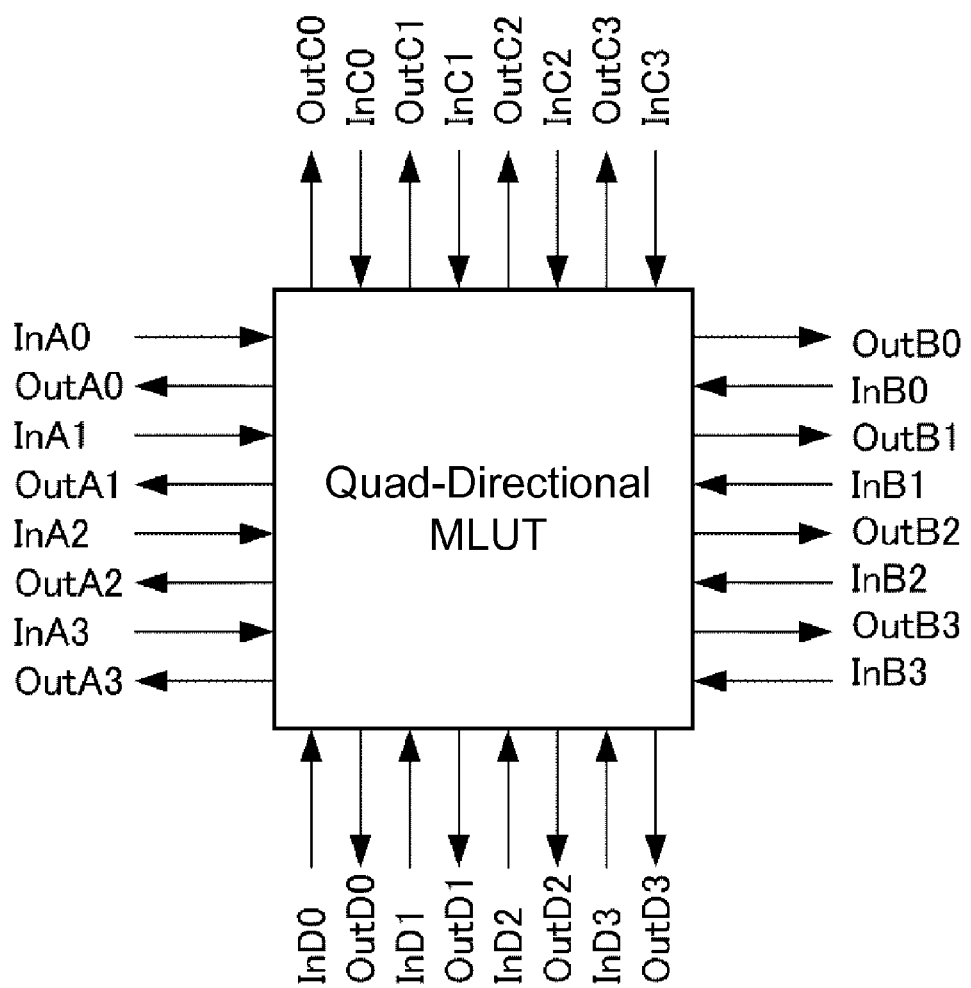
FIG. 7A is a view of an arrangement example of signal lines of a quad-directional MLUT.

FIG. 7A is a view of an arrangement example of signal lines of a quad-directional MLUT. As shown in FIG. 7A, the data input/output from left and right is the same as the bi-directional arrangement, but this arrangement additionally has data inputs InC0 to C3 from the top, data outputs OutC0 to OutC3 to the top, data inputs InD0 to InD3 from the bottom, and data outputs OutD0 to OutD3 to the bottom.

Figure 7B:
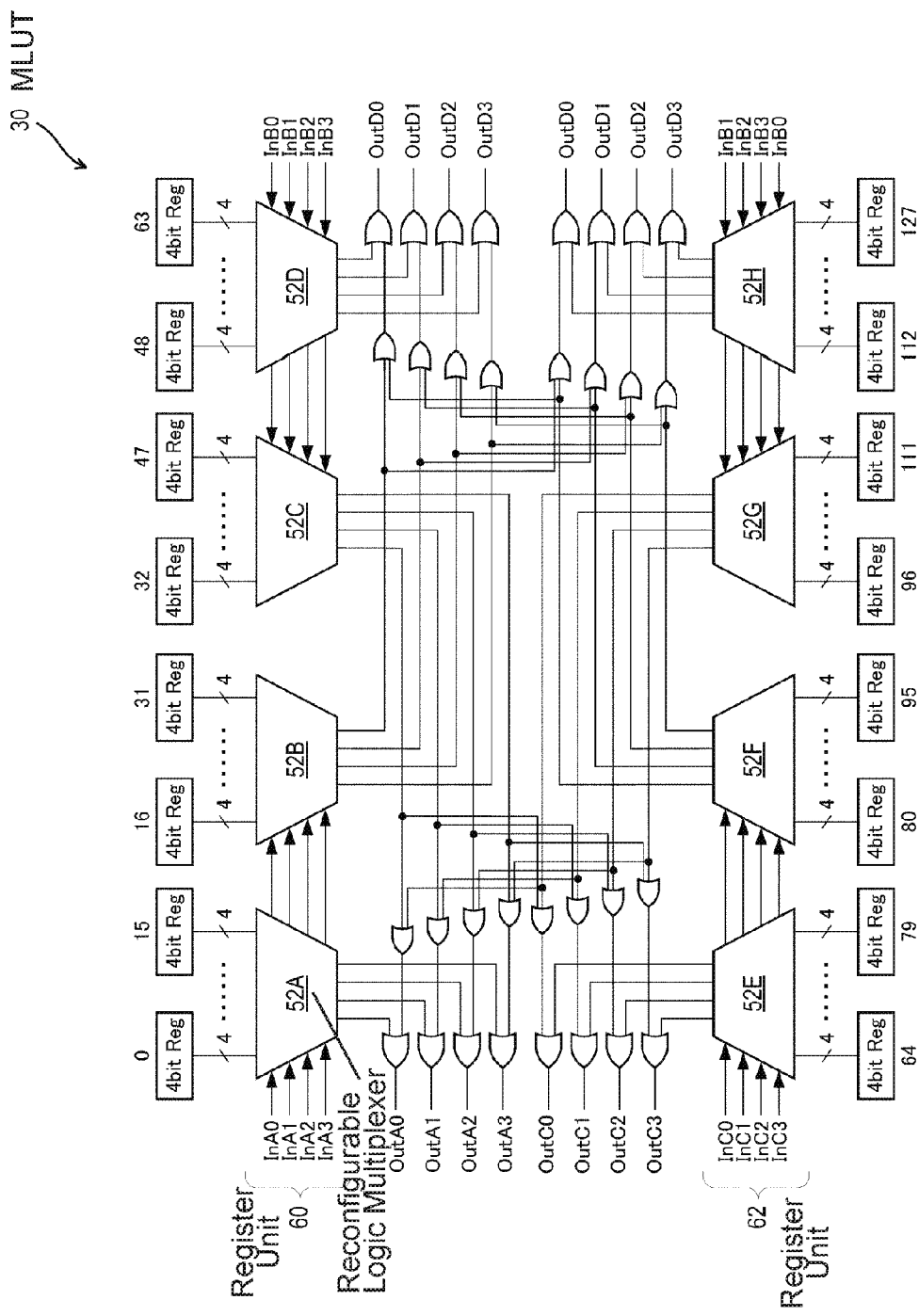
FIG. 7B is a view of one example of a quad-directional MLUT.

FIG. 7B is a view of one example of a quad-directional MLUT. It should be noted that the present example may be improved as appropriate. The signal lines of the MLUT shown in FIG. 7B are the same as the signal lines of the MLUT shown in FIG. 7A. The configuration memory is not shown, but the operation of the respective configuration elements are the same as the bi-directional MLUT. Due to there being four directions, there are four more reconfigurable logic multiplexers (52E to H) than the bi-directional MLUT, and thus more register units 62.

The outputs of the bi-directional multiplexers were logically added with the other outputs in the same direction, and this principle is the same for the quad-directional arrangement. Due to there being four directions, however, there are four logical sums. In the case of the data outputs OutC0 to OutC3, for example, these serve as the logical sums for the outputs of the reconfigurable logic multiplexers 52C, 52E, and 52G. Making the data of the reconfigurable logic multiplexers 52E and 52G "0" allows the output of 52E to be output upwards.

[4] Page Control

Figure 8:
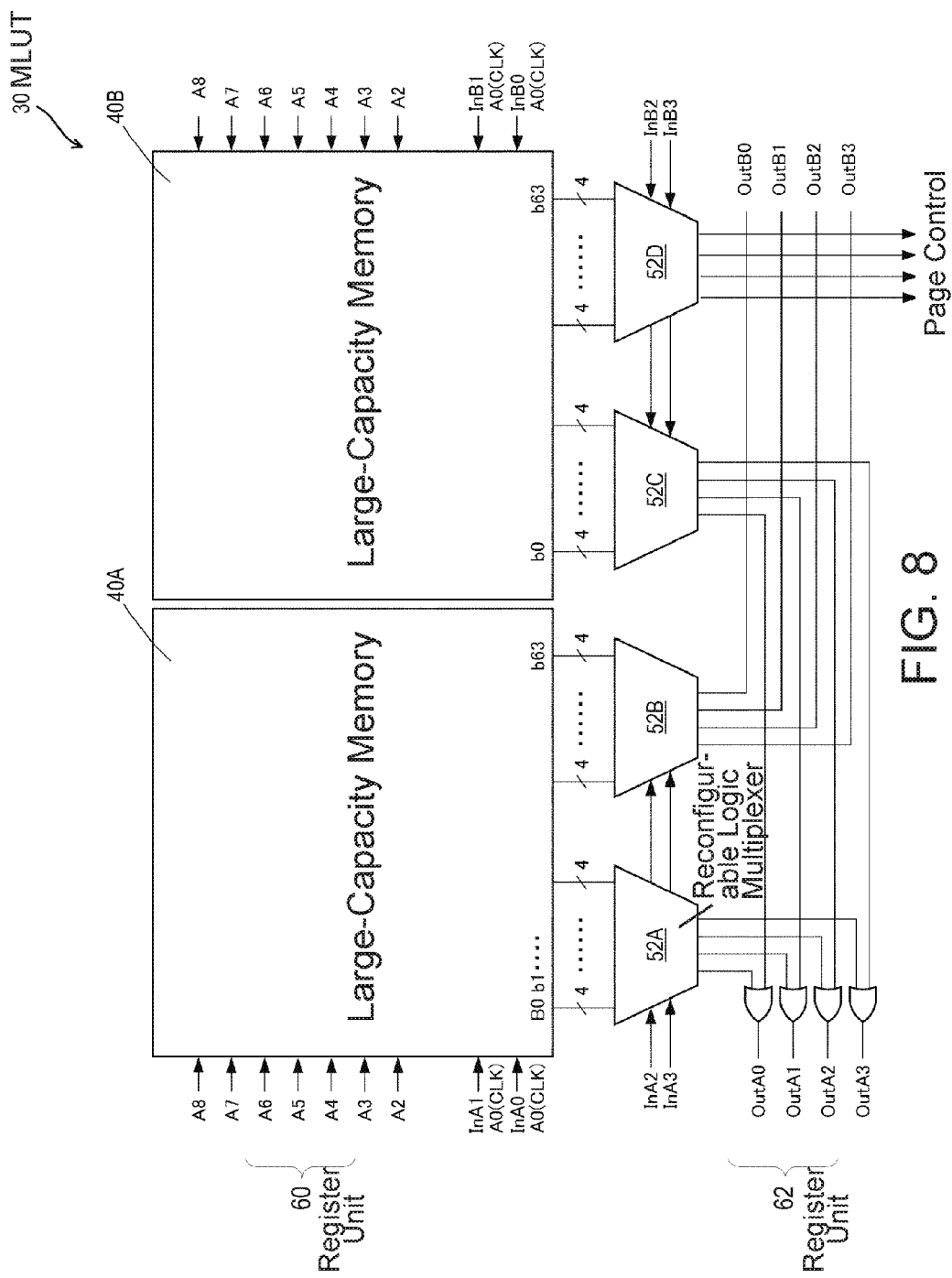
FIG. 8 is a view of one example of an MLUT that performs page control.

FIG. 8 is a view of one example of an MLUT that performs page control. The MLUT that performs page control has a portion that operates as a circuit for generating page control signals for other configuration memories, and the data outputs of this MLUT control the pages of other configuration memories.

The MLUT 30 shown in FIG. 8 has large-capacity memory cell units 40A and 40B, and each of these memory cell units is constituted by nine address lines and 64 data lines, which allows for a large capacity of $2^9$ (512) words×64 bits. In the present example, A2 to A8 can multiplex logic by page address. This example has 128 pages. Furthermore, in this example, a bi-directional MLUT array is used. The configuration memory stores configuration data of the respective pages, and thus the storage capacity becomes large. Therefore, two memories are used in this configuration. This makes clock control possible from left and right.

It should be noted that FIG. 8 is a schematic diagram, and the decoders and the like, which are the peripheral circuits of the memory cell units, are not shown, and the decoder 120 and decoder input/output unit 140 described with FIG. 5 are provided for each of the memory cell units.

Figure 9:
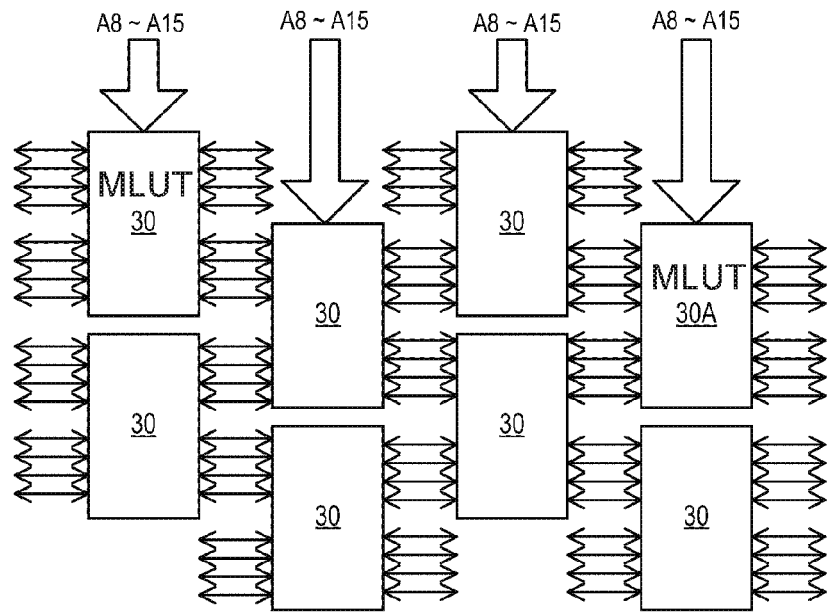
FIG. 9 is a view of an example in which a state machine is provided outside the MLUTs.

FIG. 9 is a view of an example in which a state machine is provided outside the MLUTs. As shown in FIG. 9, controlling one of the MLUTs 30 from an external system makes it possible to switch pages (truth table data) by addresses.

In a conventional MPLD, the state machine of the MPLD needs to be defined by the truth table data. Thus, it was necessary to provide truth table data that defined a plurality of prescribed states in accordance with prescribed parameters. The state machine constituted by the MLUT had to become a control circuit, and had to also generate logic circuits, unlike a data pass, and have arrangement wiring.

Figure 10:
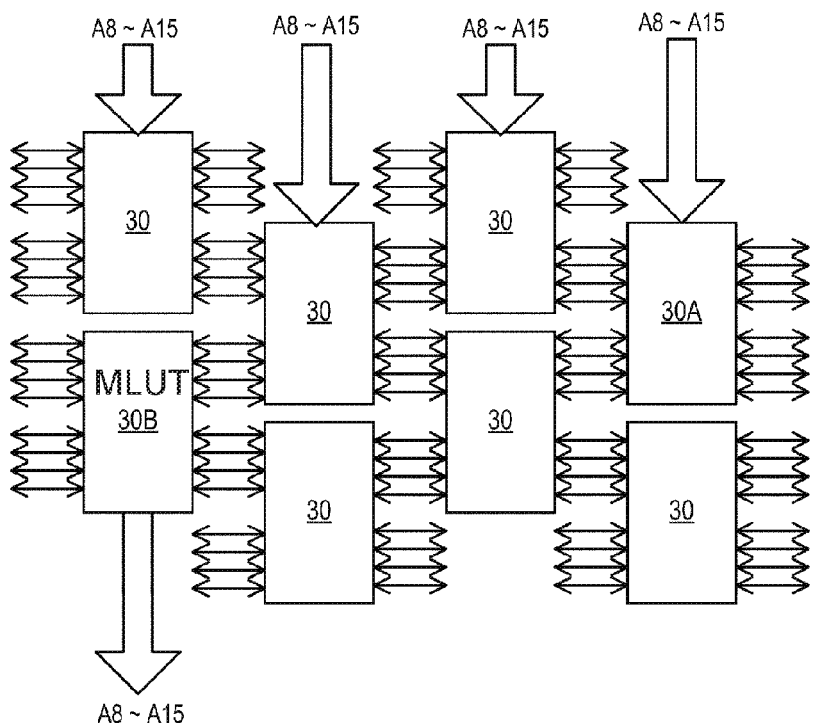
FIG. 10 is a view of an example in which a state machine is provided inside the MLUTs.

FIG. 10 is a view of an example in which a state machine is provided inside the MLUTs. FIG. 10 is an example in which a portion of the configuration data is used to provide a state machine unique to an MRLD. The circuits constituted by the MLUT 30B are caused to perform decrement operations and "for control" in the C programming language. The next page address is caused to be stored in the 0 data (0 address of the MLUT 30B) and the current address is caused to be stored in the other addresses. This makes it possible to perform "for" script control.

The MLUT 30 shown in FIG. 10 has a page switching control function, and thus it is not necessary to define the state machine with a truth table. The "for" script can process operations with the same page until a parameter of a prescribed value is reached, without outputting its own page address to the data to switch the pages, for example. If a certain condition is met (i=0, for example), then the addresses for page switching are output to the data lines at this time. The data lines are input as address lines to the other memory cell units, which allows for page switching of other memory cell units. In addition, if using a "case" script, prescribed values can cause jump addresses to be output to the data to cause page switching and operation modification. A conventional MPLD could only be a logic circuit, whereas the above makes it possible for operation synthesis in the C programming language and allows for truth value data of the MLUTs in the MPLD to be generated from the C programming language, which allows for functionality beyond that of an FPGA.

The MRLD can use semiconductor design prototypes relevant to specialized compact SRAMs and conventional large-capacity memory devices even without undergoing manufacturing. When forming the MRLD with chips, memory IP (intellectual property) is used, but in the micro-memories required by conventional MLUTs, the area of the address decoder, sense amp, and the like is large, and the component ratio of the memory itself is 50% or less. This adds to overhead and results in poor efficiency. With a large-capacity memory, the ratio with respect to the address decoder, sense amp and the like decreases, which increases memory usage efficiency. Therefore, the large-capacity memory is effective for MRLD chips, as in the current case.

[5] Configuration Data

Figure 11:
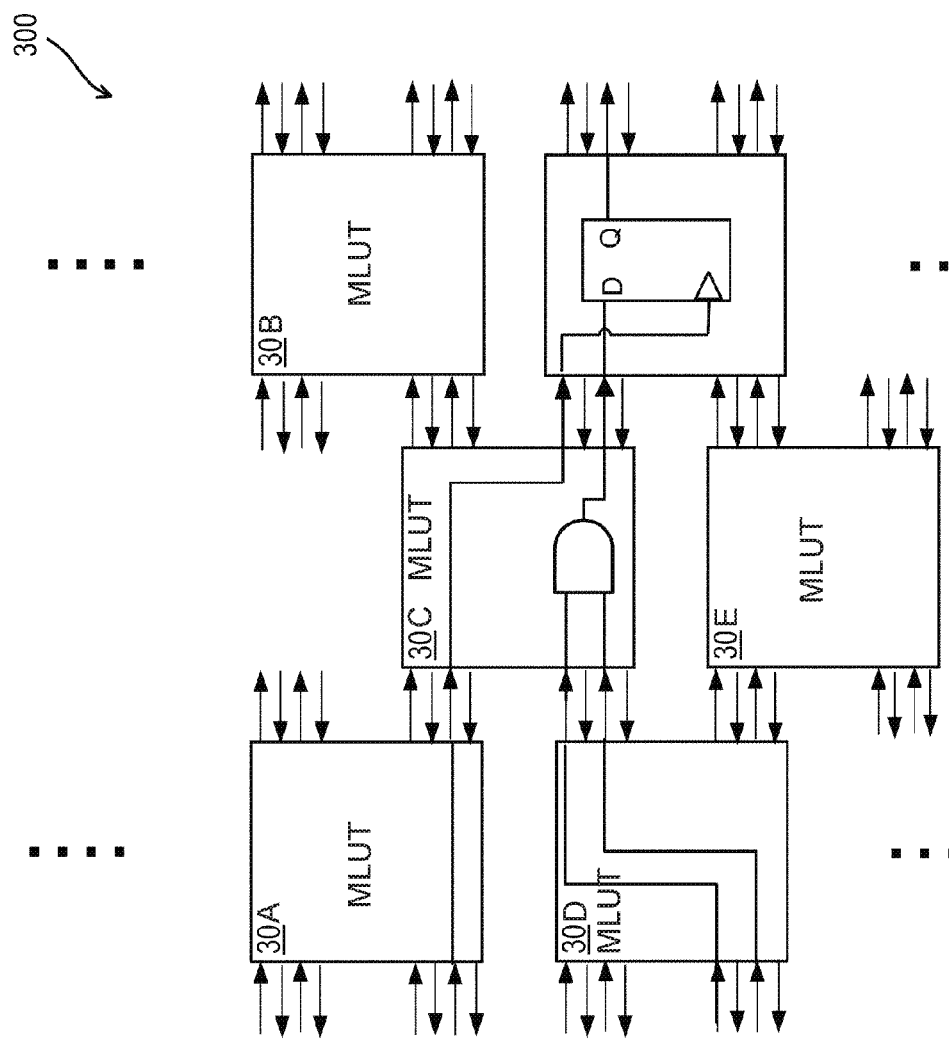
FIG. 11 shows wiring lines and logic circuits constituted by the alternately arranged MLUTs shown in FIG. 2.

The configuration data in the example in FIG. 8 is shown in FIGS. 12A to 12J. FIG. 11 shows wiring lines and logic circuits constituted by the alternately arranged MLUTs shown in FIG. 2. FIG. 11 is constituted by the alternately arranged MLUTs described in FIG. 2 and two configuration memories (left side, right side). In the example shown in FIG. 11, the logic circuits and wiring lines are constituted by the MLUTs 30A to 30E. Furthermore, FIGS. 12A to 12J described below also include truth table data selected by page control.

Figure 12A:
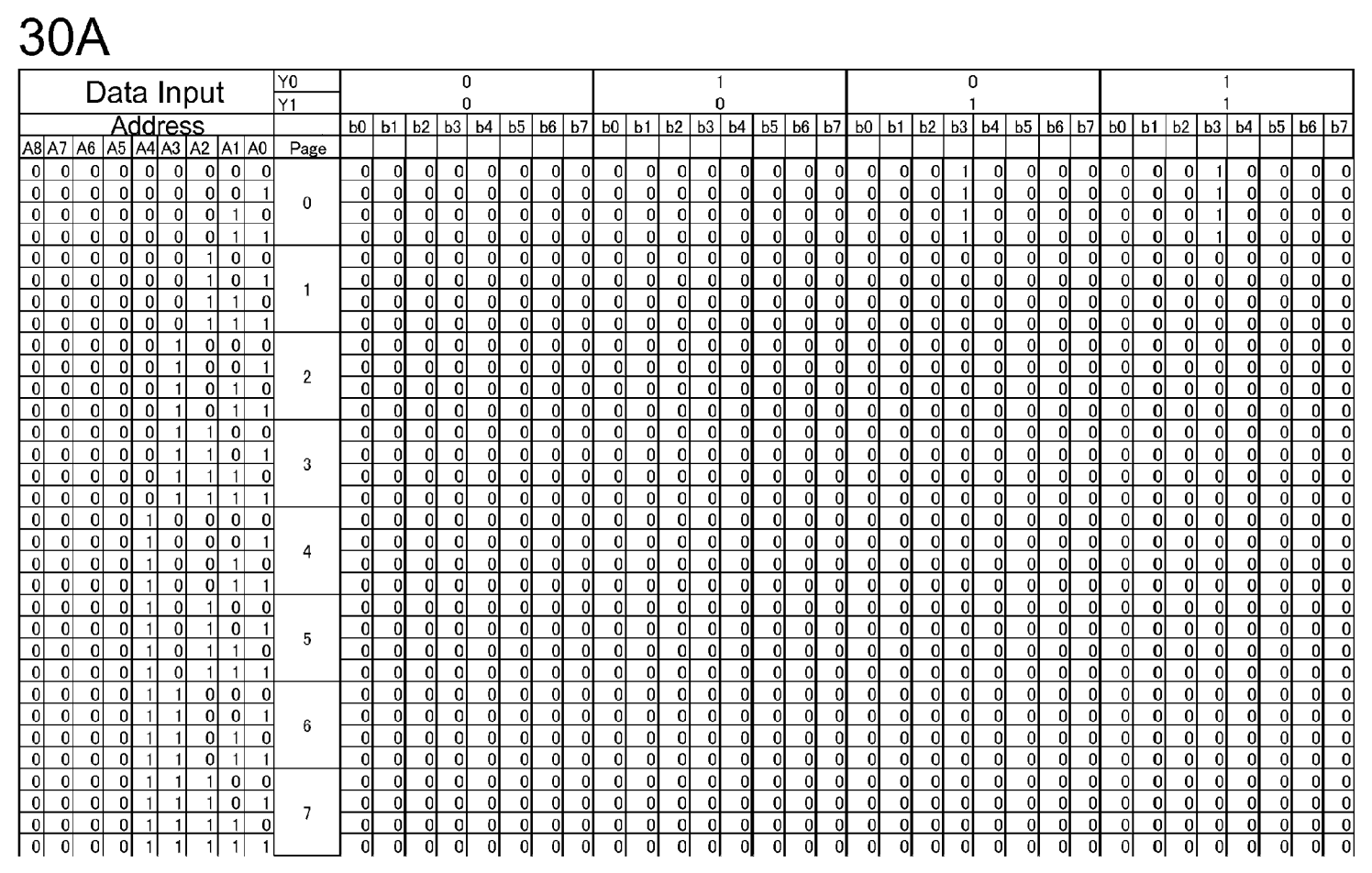
Figure 12B:
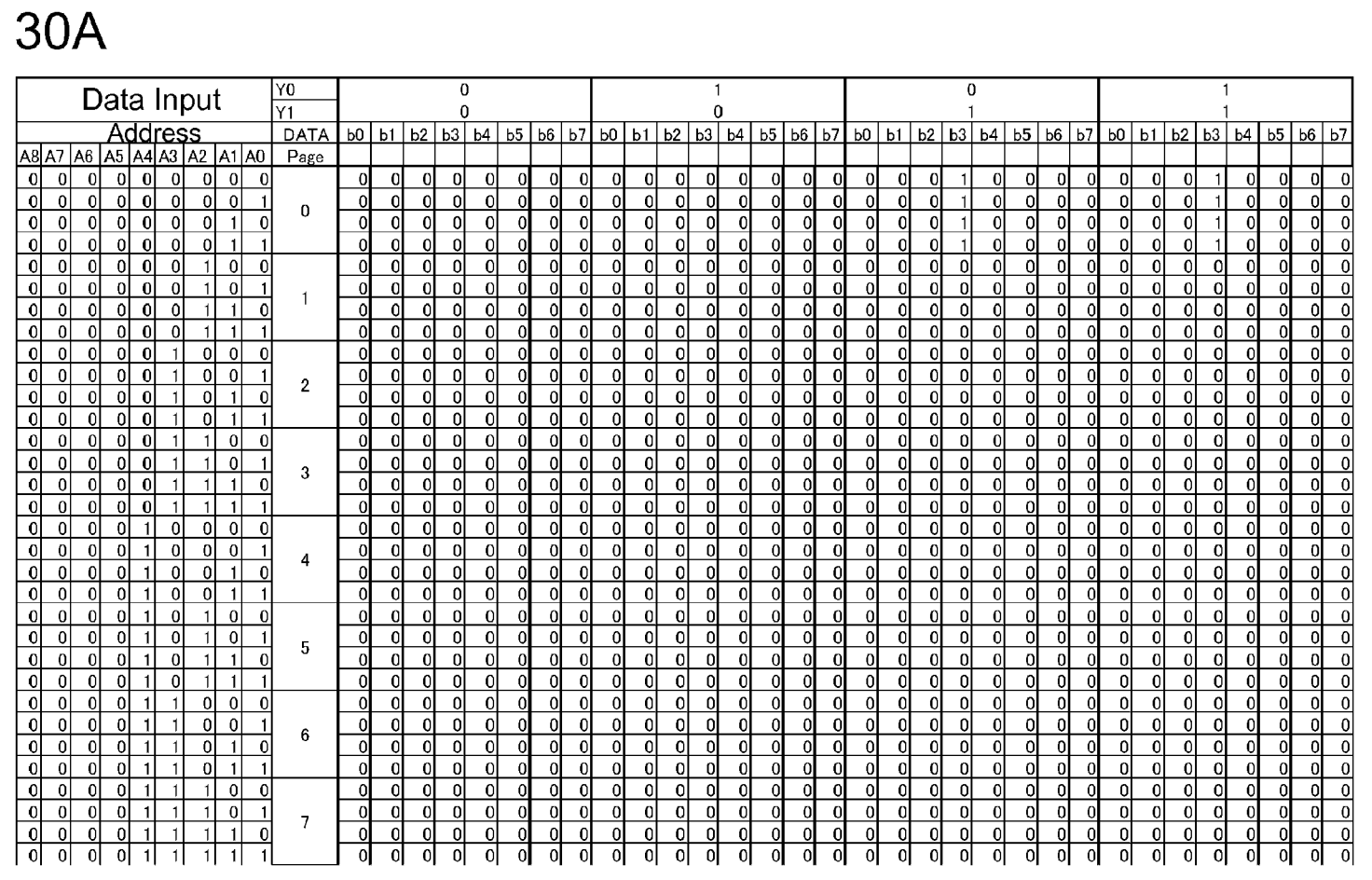
Figure 12C:
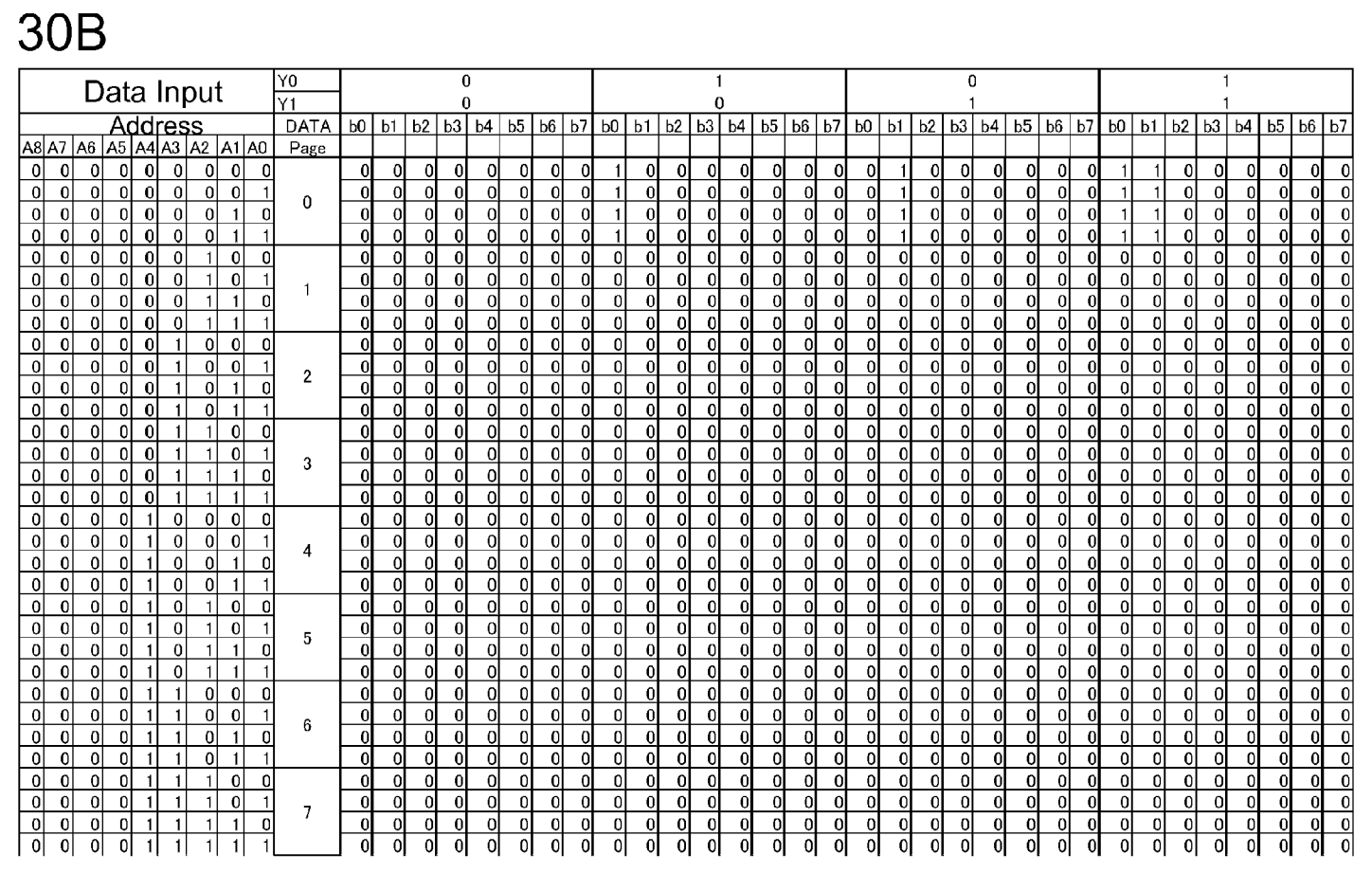
Figure 12D:
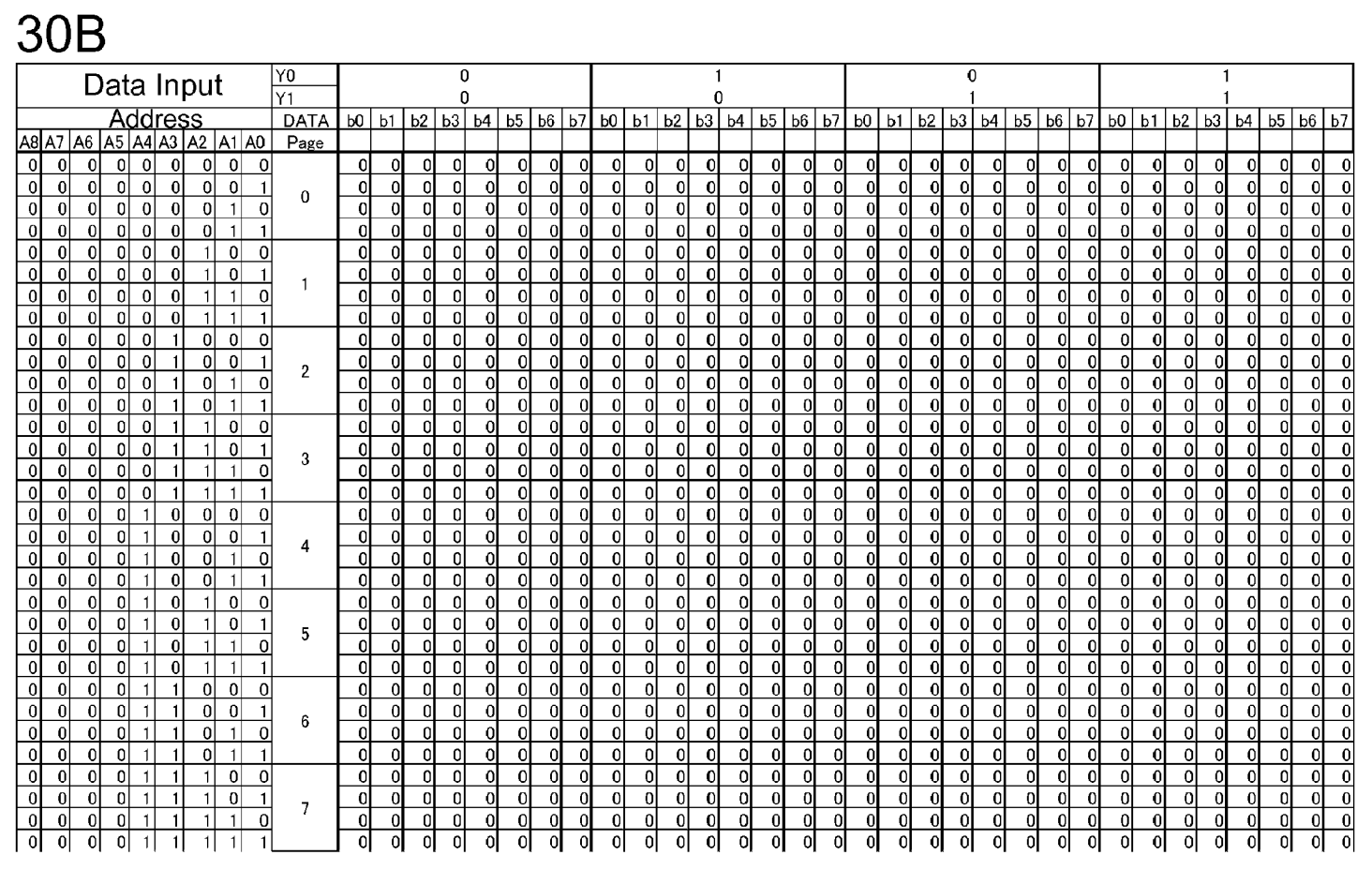
Figure 12E:
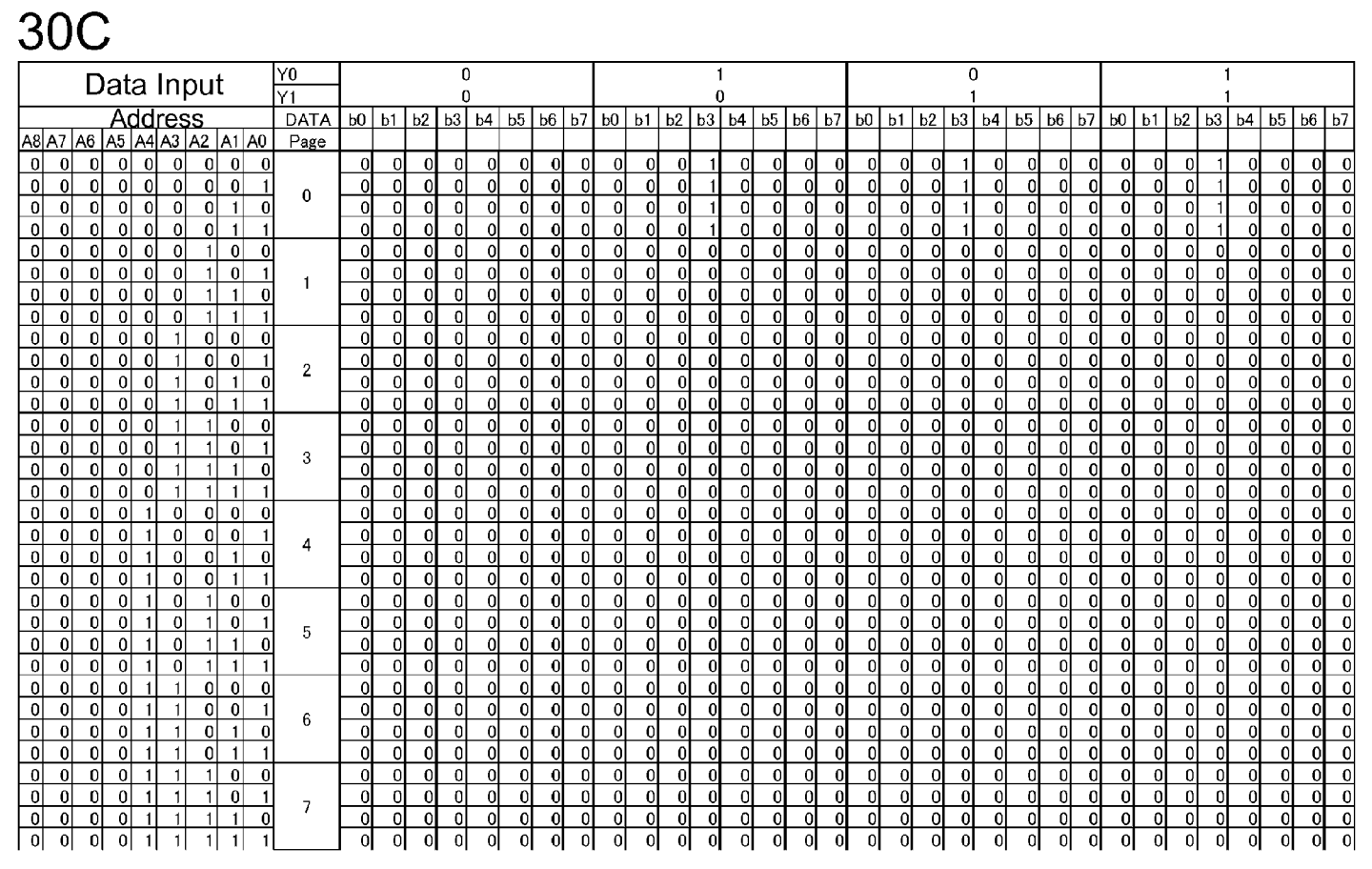
Figure 12F:
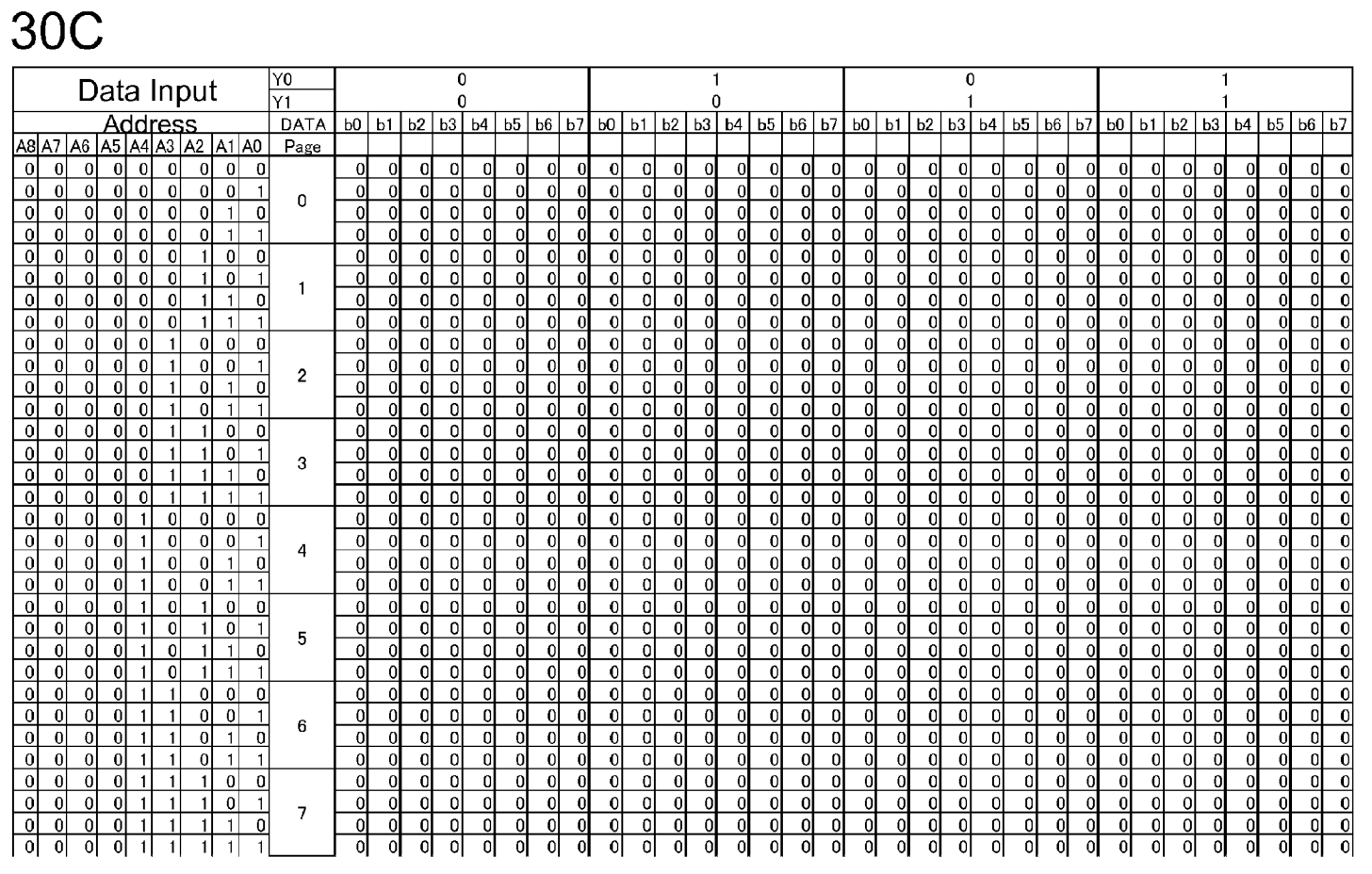

FIG. 12A is one example of configuration data stored in a configuration memory on the left side of the MLUT 30A. FIG. 12B is a view of one example of configuration data stored in a configuration memory on the right side of the MLUT 30A. FIG. 12C is a view of one example of configuration data stored in a configuration memory on the left side of the MLUT 30B. FIG. 12D is a view of one example of configuration data stored in a configuration memory on the right side of the MLUT 30B. FIG. 12E is a view of one example of configuration data stored in a configuration memory on the left side of the MLUT 30C. FIG. 12F is a view of one example of configuration data stored in a configuration memory on the right side of the MLUT 30C.

Figure 12G:
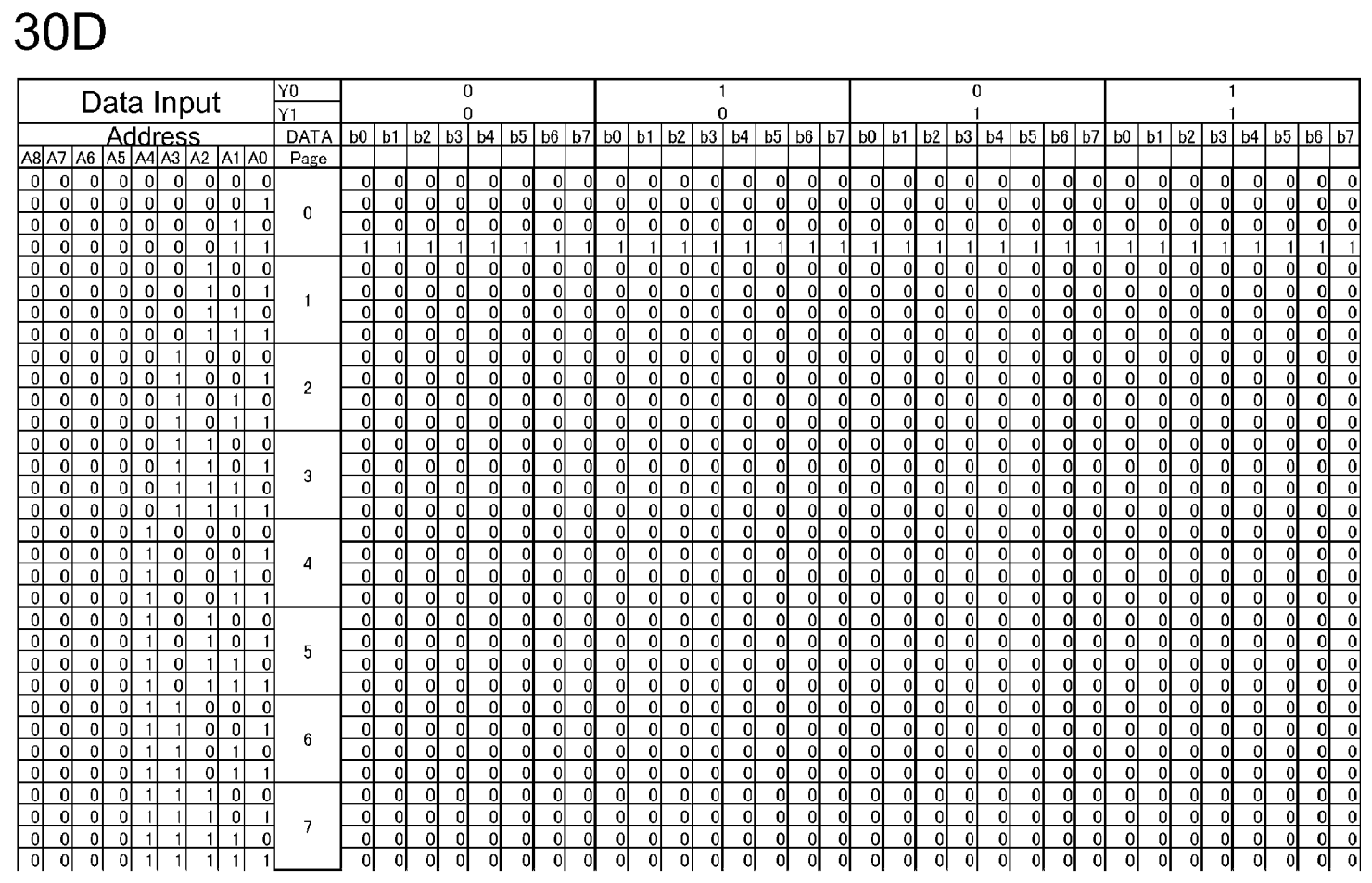
Figure 12H:
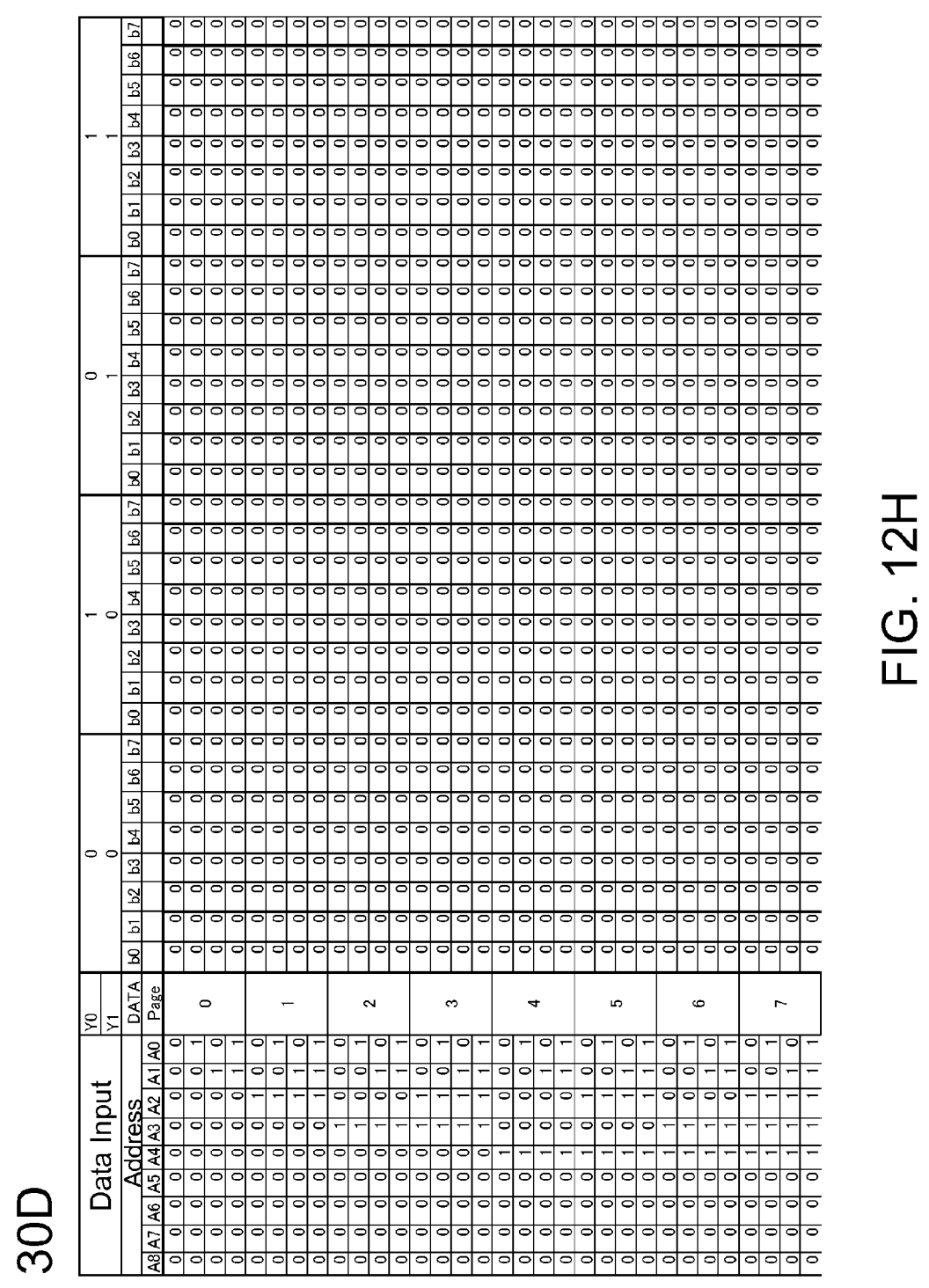
Figure 12I:
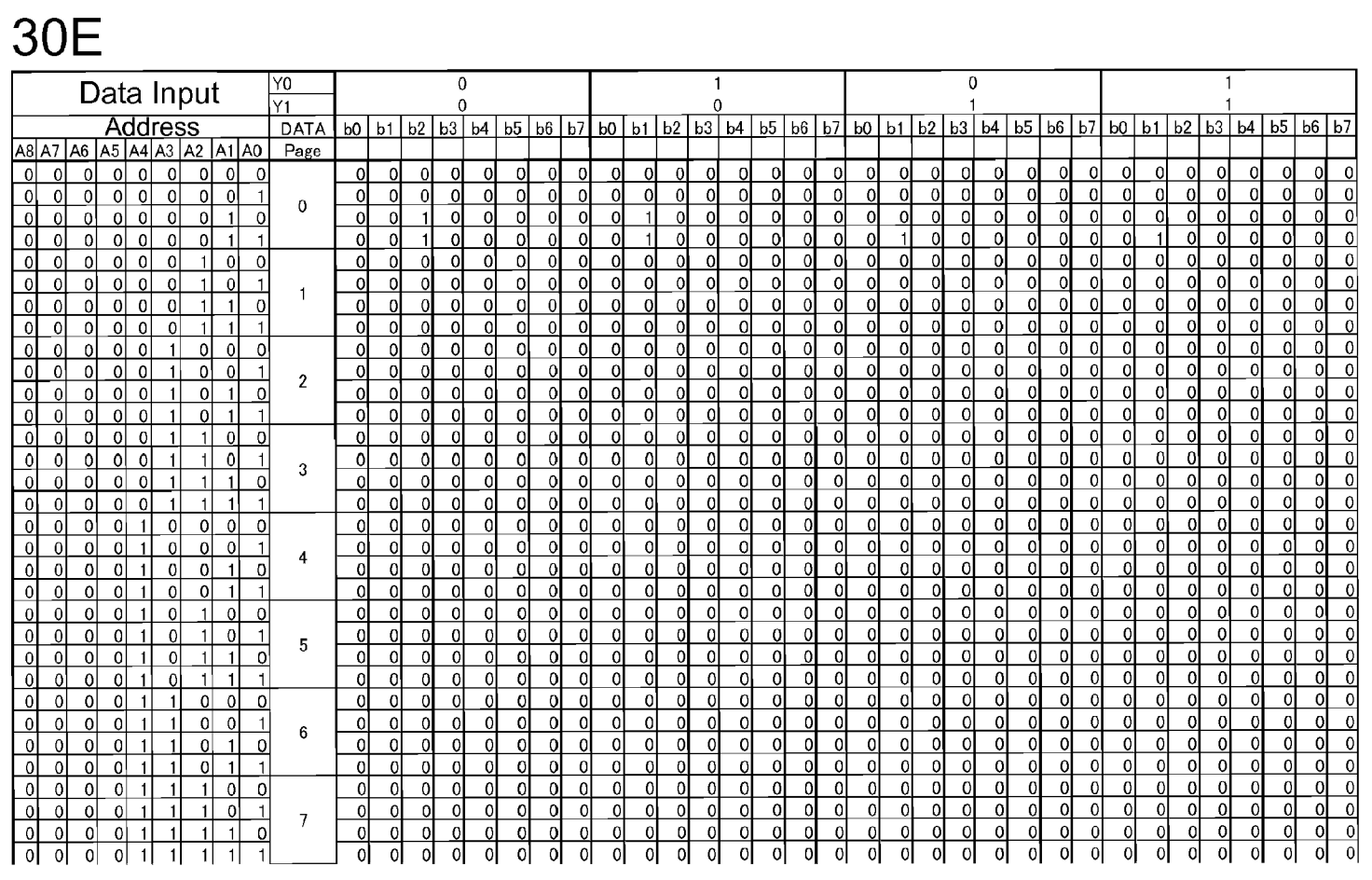
Figure 12J:
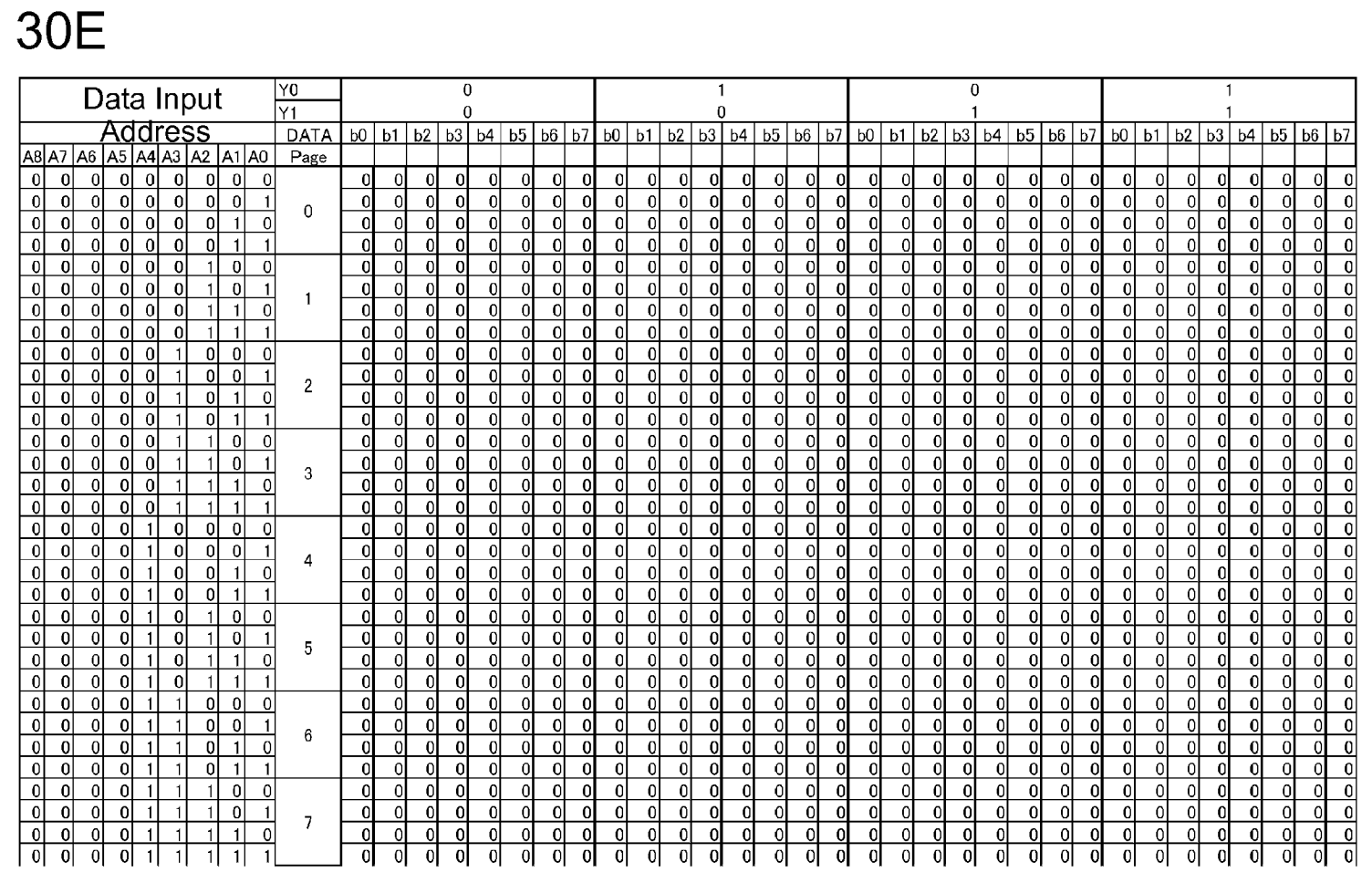

FIG. 12G is a view of one example of configuration data stored in a configuration memory on the left side of the MLUT 30D. FIG. 12H is a view of one example of configuration data stored in a configuration memory on the right side of the MLUT 30D. FIG. 12I is a view of one example of configuration data stored in a configuration memory on the left side of the MLUT 30E. FIG. 12J is a view of one example of configuration data stored in a configuration memory on the right side of the MLUT 30E.

As described above, the outputs of the reconfigurable logic multiplexer are logically added; thus, making the configuration data of routes with no signal outputs "0" creates configuration data such that desired logical computations are output as a result.

[6] Truth Table Data Generation Method

The truth table data of the reconfigurable semiconductor device is generated by an information processing device that executes a software program for logical composition.

Figure 13:
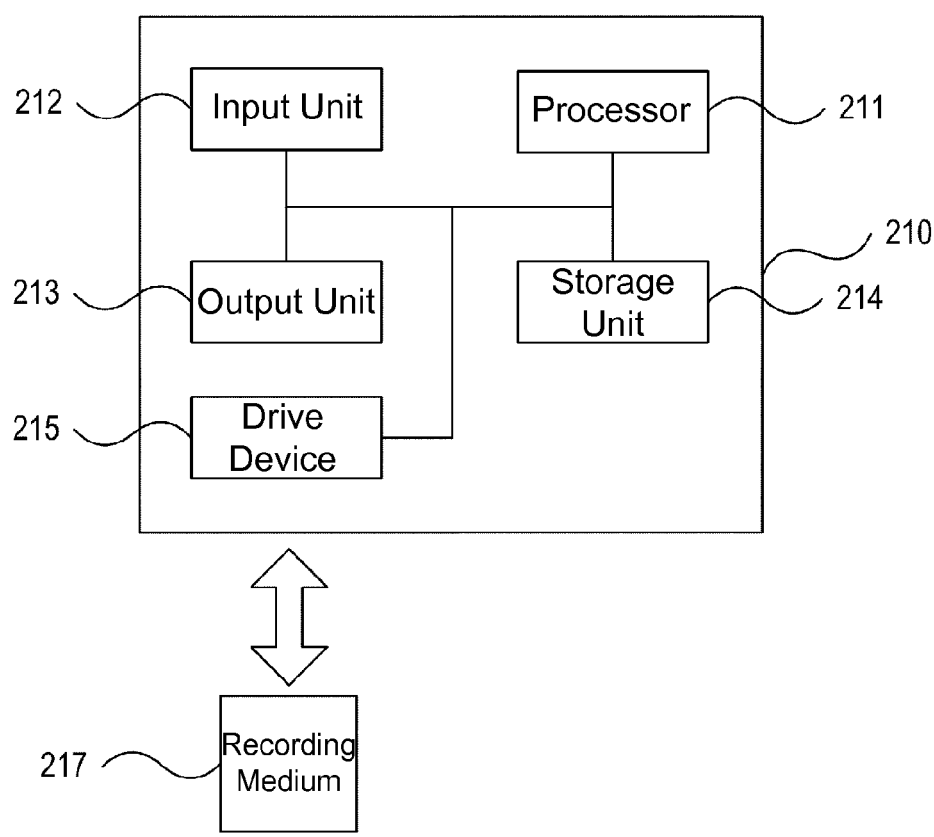
FIG. 13 is a view of a hardware configuration of an information processing device that generates truth table data.

FIG. 13 shows one example of a hardware configuration of the information processing device. An information processing device 210 has a processor 211, input unit 212, output unit 213, storage unit 214, and drive device 215. The processor 211 stores truth table data in the storage unit 214, and this truth table data is generated by software for layout/wiring input to the input unit 212; circuit description language such as C description language or hardware description language (HDL) for designing integrated circuits; and execution of the above-mentioned software. In addition, the processor 211 executes software for layout/wiring, performs processing of the layout/wiring shown below with respect to the circuit descriptions stored in the storage unit 214, and outputs the truth table data to the output unit 213. A reconfigurable logic device 20 (not shown in FIG. 13) can connect to the output unit 213, and the processor 211 executes a logical composition process to write the generated truth table data to the reconfigurable logic device 20 via the output unit 213. The output unit 213 may connect to an external network. In such a case, the software program used for logical composition sends and receives signals via the network. The driver device 215 is a device that can read/write a storage medium 217 such as a DVD (digital versatile disc), flash memory, or the like, for example. The drive device 215 includes a motor for causing the storage medium 217 to rotate and a head or the like for read/write of the data on the storage medium 217. It should be noted that the storage medium 217 can store the program for logical composition or the truth table data. The drive device 215 reads out the program from the set storage medium 217. The processor 211 stores the read-out program or the truth table data in the storage unit 214 via the drive device 215.

The functions of the logic elements and/or connective elements are constructed by the truth table data being read by the semiconductor device 20 and a specific method of collaboration between truth table data and the hardware resources. Furthermore, the truth table data can be surmised to be data having a structure showing logical constructions that are referred to as "truth tables."

The embodiments described above are merely illustrative, and the combination, modification, and variations of the constituting elements of the respective above-mentioned aspects are obvious for a person with ordinary skill in the art; indeed, a person with ordinary skill in the art could perform various types of modifications to the above-mentioned embodiments without departing from the scope of the invention as described in the claims and the principles of the present invention.

DESCRIPTION OF REFERENCE CHARACTERS

20 MRLD
30 MLUT
40 configuration memory
50 reconfigurable logic multiplexer
60 register unit
200 clock transition detecting unit
300 MLUT array

What is claimed:

1. A reconfigurable logic device for forming a plurality of logic circuits in accordance with configuration data, comprising:
    a plurality of multi-lookup table units,
    wherein each of the multi-lookup table units includes:
        a rewritable configuration memory that stores configuration data for the multi-lookup table unit; and
        data input lines;
        data output lines; and
        a reconfigurable logic multiplexer connected to the rewritable configuration memory, the reconfigurable logic multiplexer performing one of or both of:
            in accordance with the configuration data, selectively linking at least some of the data input lines to at least some of the data output lines so that data inputted to said at least some of the data input lines are transmitted to said at least some of the data output lines, and
            in accordance with the configuration data, outputting, to at least some of the data output lines, data obtained by performing a logical operation on data received from at least some of the data input lines, and
    wherein the multi-lookup table units that are adjacent to one another are connected through the data input lines and the data output lines of the respective multi-lookup table units.

2. The reconfigurable logic device according to claim 1,
    wherein the configuration data in each of the plurality of multi-lookup table units includes a plurality of truth tables each of which defines a logical operation or connective paths, and
    wherein one of the plurality of truth tables is selected in accordance with the data inputted from at least some of the data input lines.

3. The reconfigurable logic device according to claim 1,
    wherein the reconfigurable logic multiplexer is provided in a plurality in each of the multi-lookup table units, and
    wherein one of the reconfigurable logic multiplexers is provided for each combination of a direction of the data input line and a direction of the data output line.

4. The reconfigurable logic device according to claim 1,
    wherein each of the plurality of multi-lookup table units includes:
        a holding unit that holds the configuration data read out from the configuration memory and outputs said configuration data that is held to the reconfigurable logic multiplexer.

5. The reconfigurable logic device according to claim 4,
    wherein the reconfigurable logic multiplexer in each of the plurality of multi-lookup table units selects and outputs the configuration data held by the holding unit in accordance with the data inputted from the data input lines.

6. The reconfigurable logic device according to claim 1,
    wherein at least some of the data input lines of one of the respective multi-lookup tables units are connected to at least some of the data output lines of the multi-lookup table units adjacent thereto.

7. The reconfigurable logic device according to claim 1,
    wherein the configuration memory comprises a plurality of memories, one of said plurality of memories being provided for each data output direction.

8. The reconfigurable logic device according to claim 1,
    wherein the configuration memory in each of the plurality of multi-lookup table units includes a clock transition detecting unit that generates a clock at a moment when an address to be outputted to the configuration memory is received, and
    wherein the configuration memory operates in synchronization with said clock.

9. The reconfigurable logic device according to claim 2,
    wherein at least one of the plurality of truth tables is outputted to data output lines that are respectively connected to address lines of the configuration memory, and
    wherein the plurality of truth tables are written in the configuration memory in accordance with inputs from said address lines.

10. The reconfigurable logic device according to claim 2,
    wherein said plurality of truth tables are written in the configuration memory in accordance with inputs from address lines that are connected to outside.

11. A method of controlling a reconfigurable logic device that forms a plurality of logic circuits in accordance with configuration data, said reconfigurable logic device having a plurality of multi-lookup table units, each of the multi-lookup table units including a rewritable configuration memory that stores configuration data for the multi-lookup table unit, data input lines, data output lines, and a reconfigurable logic multiplexer connected to the rewritable configuration memory, wherein the multi-lookup table units that are adjacent to one another are connected through the data input lines and the data output lines of the respective multi-lookup table units, the method comprising:
    causing the reconfigurable logic multiplexer to receive the configuration data and, in accordance therewith, selectively link at least some of the data input lines to at least some of the data output lines so that data inputted to said at least some of the data input lines are transmitted to said at least some of the data output lines; and
    causing the reconfigurable logic multiplexer to receive the configuration data and, in accordance therewith, output, to at least some of the data output lines, data obtained by performing a logical operation on data received from at least some of the data input lines.

12. The method according to claim 11,
    wherein each of the plurality of multi-lookup table units includes a holding unit that holds the configuration data read out from the configuration memory and outputs the configuration data that is held to the reconfigurable logic multiplexer, and
    wherein the reconfigurable logic multiplexer selects and outputs the configuration data held by the holding unit in accordance with the inputted data from the data input lines.

13. The method according to claim 11, wherein the configuration memory in each of the plurality of multi-lookup table units includes a clock transition detecting unit that generates a clock at a moment when an address to be outputted to the configuration memory is received, and wherein the configuration memory operates in synchronization with the clock.

14. A non-transitory storage medium that stores instructions executable by a processor, said instructions being for controlling a reconfigurable logic device having a plurality of multi-lookup table units, each of the multi-lookup table units including a rewritable configuration memory that stores configuration data for the multi-lookup table unit, data input lines, data output lines, and a reconfigurable logic multiplexer connected to the rewritable configuration memory, wherein the multi-lookup table units that are adjacent to one another are connected through the data input lines and the data output lines of the respective multi-lookup table units, the instructions causing the processor to perform the following:

causing the reconfigurable logic multiplexer to receive the configuration data and, in accordance therewith, selectively link at least some of the data input lines to at least some of the data output lines so that data inputted to said at least some of the data input lines are transmitted to said at least some of the data output lines; and causing the reconfigurable logic multiplexer to receive the configuration data, and, in accordance therewith, output, to at least some of the data output lines, data obtained by performing a logical operation on data receive from at least some of the data input lines.

* * * * *